US 12,087,735 B2

(12) United States Patent
Takeno et al.

(10) Patent No.: US 12,087,735 B2
(45) Date of Patent: Sep. 10, 2024

(54) SEMICONDUCTOR DEVICE

(71) Applicant: SOCIONEXT INC., Kanagawa (JP)

(72) Inventors: Hirotaka Takeno, Yokohama (JP);
Wenzhen Wang, Yokohama (JP);
Atsushi Okamoto, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 574 days.

(21) Appl. No.: 17/210,743

(22) Filed: Mar. 24, 2021

(65) Prior Publication Data

US 2021/0210468 A1 Jul. 8, 2021

Related U.S. Application Data

(63) Continuation of application No. PCT/JP2018/036244, filed on Sep. 28, 2018.

(51) Int. Cl.
*H01L 25/065* (2023.01)
*G11C 5/14* (2006.01)
(Continued)

(52) U.S. Cl.
CPC ...... *H01L 25/0657* (2013.01); *H01L 27/0207* (2013.01); *H01L 24/73* (2013.01);
(Continued)

(58) Field of Classification Search
CPC ......... H01L 23/528; H01L 2225/06541; H01L 23/5226; H01L 25/0657
See application file for complete search history.

(56) References Cited

U.S. PATENT DOCUMENTS 6,355,950 B1 3/2002 Livengood et al.
9,754,923 B1 9/2017 Xie et al.
(Continued)

FOREIGN PATENT DOCUMENTS

JP 2005-032839 A 2/2005
JP 2008-251835 A 10/2008
(Continued)

OTHER PUBLICATIONS

International Search Report and Written Opinion issued in International Application No. PCT/JP2018/036244 dated Nov. 27, 2018; with partial English translation.
(Continued)

*Primary Examiner* — Anthony Ho
*Assistant Examiner* — David J Goodwin
(74) *Attorney, Agent, or Firm* — Rimon P.C.

(57) ABSTRACT

A semiconductor device includes a first semiconductor chip, and a second semiconductor chip, wherein the first semiconductor chip includes a substrate including a first principal surface facing the second semiconductor chip and a second principal surface opposite to the first principal surface, a first power supply line and a second power supply line arranged on the second principal surface of the substrate, a power supply switch circuit arranged electrically between the first power supply line and the second power supply line, a first via arranged in the substrate to extend from the first power supply line to the first principal surface, and a second via arranged in the substrate to extend from the second power supply line to the first principal surface, wherein the second semiconductor chip includes a third power supply line connected to the first via, and a fourth power supply line connected to the second via.

19 Claims, 34 Drawing Sheets

(51) Int. Cl.
*H01L 27/02* (2006.01)
*H01L 23/00* (2006.01)

(52) U.S. Cl.
CPC .............. *H01L 2224/73204* (2013.01); *H01L 2225/06513* (2013.01); *H01L 2225/06524* (2013.01); *H01L 2225/06527* (2013.01); *H01L 2225/06544* (2013.01)

(56) References Cited

U.S. PATENT DOCUMENTS

| | | |
|---|---|---|
| 2008/0239780 A1 | 10/2008 | Sasaki et al. |
| 2010/0123515 A1 | 5/2010 | Sasaki et al. |
| 2010/0165776 A1 | 7/2010 | Tada |
| 2012/0249222 A1 | 10/2012 | Ko et al. |
| 2015/0187642 A1* | 7/2015 | Batra ................ H01L 21/76898 257/774 |
| 2016/0020268 A1 | 1/2016 | Suwada |
| 2017/0026036 A1 | 1/2017 | Chiyonobu et al. |
| 2017/0033102 A1* | 2/2017 | Kim .................... H01L 27/0207 |
| 2017/0039312 A1 | 2/2017 | Fukaya |
| 2017/0154655 A1* | 6/2017 | Seo ........................ G11C 5/141 |
| 2019/0221514 A1* | 7/2019 | Kim .................... H01L 27/0207 |
| 2019/0295940 A1* | 9/2019 | Liaw .................. H01L 23/5222 |

FOREIGN PATENT DOCUMENTS

| | | |
|---|---|---|
| JP | 2010-118590 A | 5/2010 |
| JP | 2010-225782 A | 10/2010 |
| JP | 2014-072488 A | 4/2014 |
| JP | 2016-025103 A | 2/2016 |
| JP | 2016-035966 A | 3/2016 |
| JP | 2017-028085 A | 2/2017 |
| JP | 2017-037920 A | 2/2017 |
| WO | 2007/099841 A1 | 9/2007 |

OTHER PUBLICATIONS

Chinese Office Action and Search Report dated Dec. 1, 2023 issued in the corresponding Chinese Patent Application No. 201880097878.8, with English translation of the Office Action and Search Report.
Chinese Office Action dated May 9, 2024 issued in the corresponding Chinese Patent Application No. 201880097878.8, with English translation.

* cited by examiner

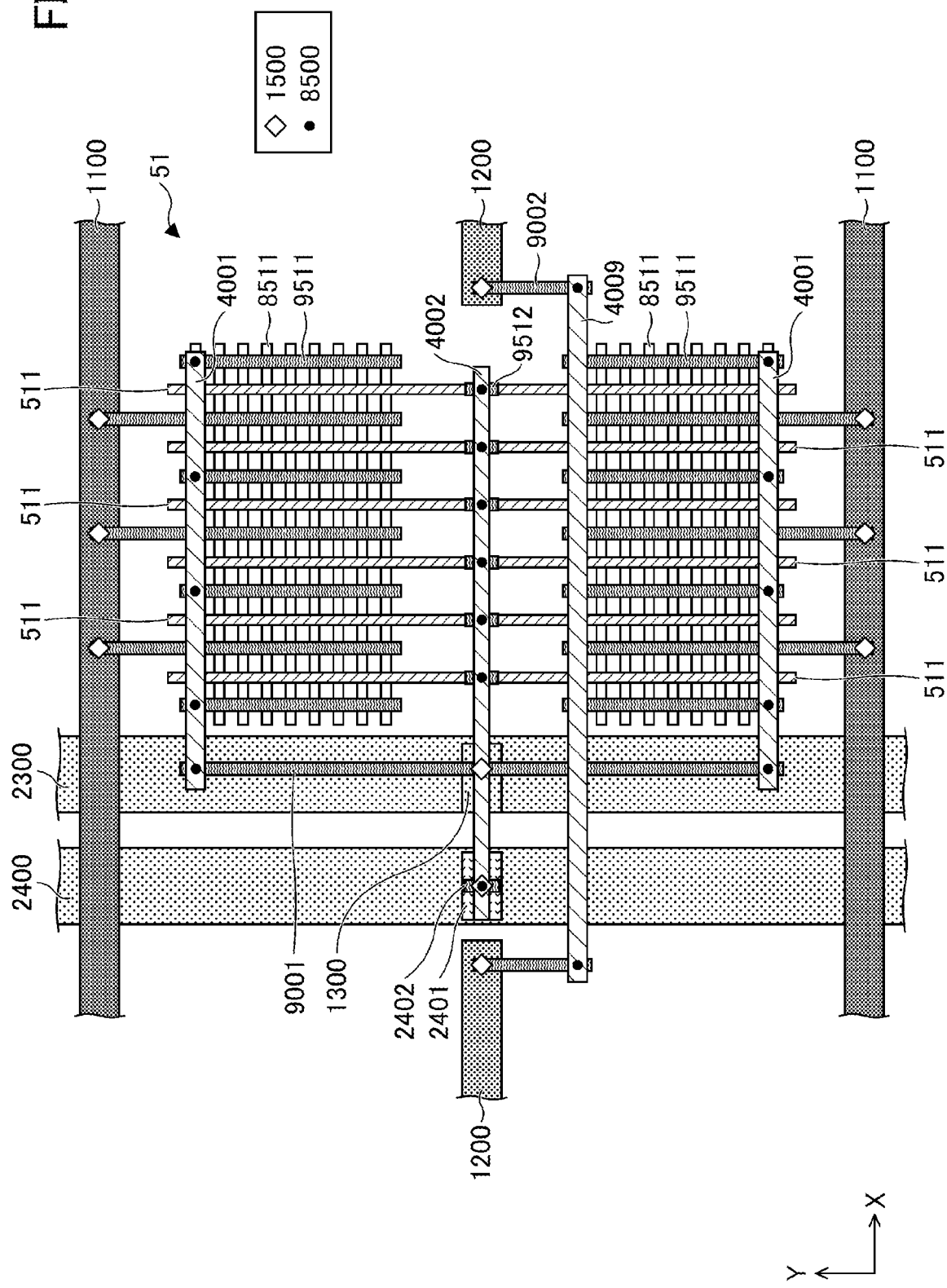

SEMICONDUCTOR DEVICE

CROSS-REFERENCE TO RELATED APPLICATION

This application is a continuation application of International Application PCT/JP2018/036244 filed on Sep. 28, 2018 and designated the U.S., the entire contents of which are incorporated herein by reference.

FIELD

The embodiments discussed herein are related to a semiconductor device.

BACKGROUND

Semiconductor devices include various circuit areas, an example of which is a standard cell area. The standard cell area includes various logic circuits and a power supply switch circuit.

SUMMARY

According to an aspect of an embodiment, a semiconductor device includes a first semiconductor chip, and a second semiconductor chip, wherein the first semiconductor chip includes a substrate including a first principal surface facing the second semiconductor chip and a second principal surface opposite to the first principal surface, a first power supply line and a second power supply line arranged on the second principal surface of the substrate, a power supply switch circuit arranged electrically between the first power supply line and the second power supply line, a first via arranged in the substrate to extend from the first power supply line to the first principal surface, and a second via arranged in the substrate to extend from the second power supply line to the first principal surface, wherein the second semiconductor chip includes a third power supply line connected to the first via, and a fourth power supply line connected to the second via.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 35 is a plan view illustrating a configuration of the power supply switch circuit according to the eighth embodiment.

DESCRIPTION OF EMBODIMENTS

Figure 1:
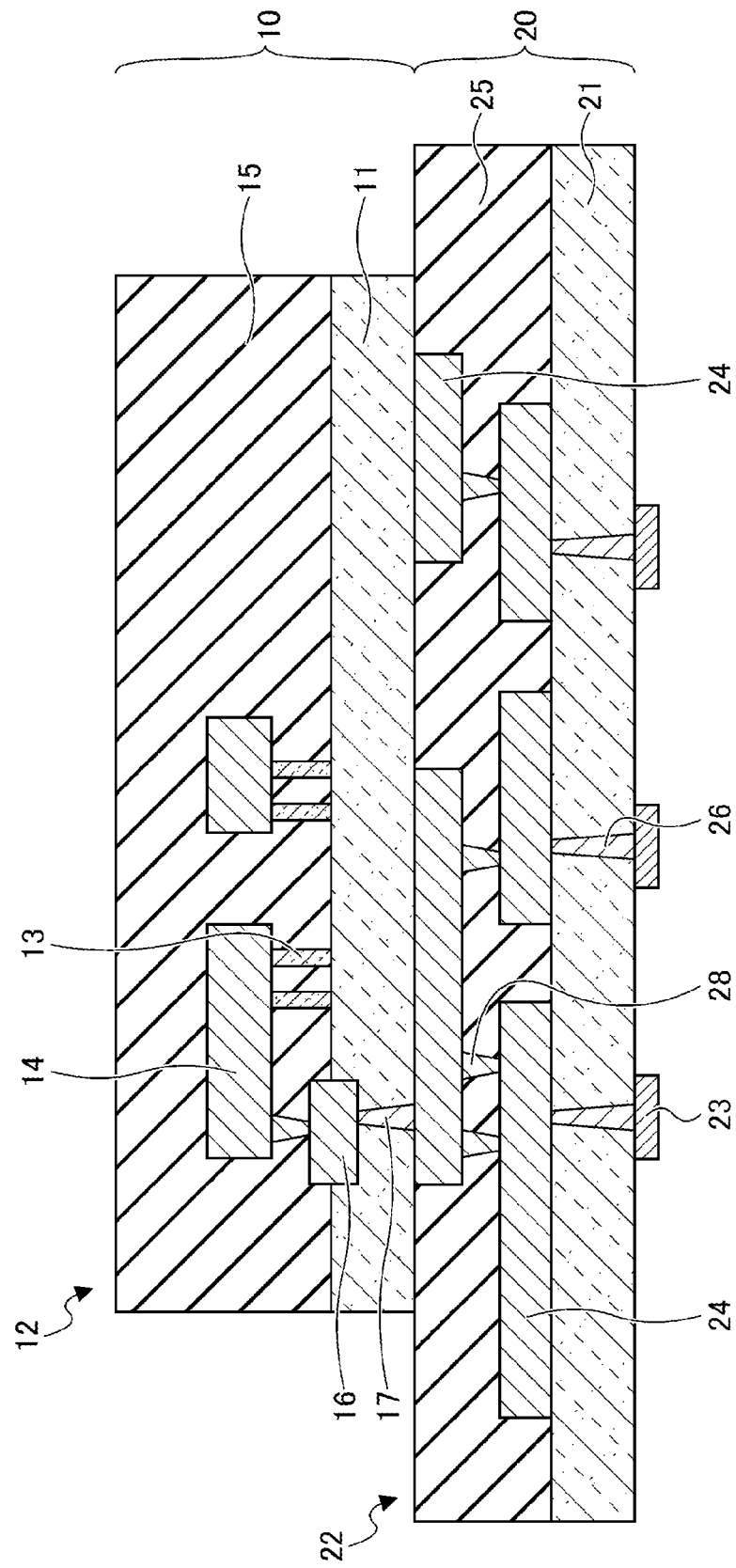
FIG. 1 is a cross-sectional view illustrating a semiconductor device according to a first embodiment.

Semiconductor devices include various circuit areas, an example of which is a standard cell area. The standard cell area includes various logic circuits and a power supply switch circuit.

For example, the power supply switch circuit is provided between a power supply line at a potential of VDD supplied to a semiconductor device and a power supply line at a potential of VDDV supplied to a transistor in a logic circuit. The power supply switch circuit is configured to turn on and off the supply of the power at the potential of VDDV to the transistor. With the use of the power supply switch circuit, the supply of the power can be turned off when the logic circuit does not need to operate, the leakage current generated by the transistors constituting the logic circuit can be reduced, and the power consumption can be reduced.

U.S. Pat. Nos. 6,355,950, 9,754,923, and Japanese Laid-open Patent Publication No. 2014-072488 disclose techniques for pasting a secondary semiconductor chip including conductive traces onto a backside of a primary semiconductor chip and supplying a power supply potential to transistors of the primary semiconductor chip through the conductive traces of the secondary semiconductor chip.

However, in such a semiconductor device including the power supply switch circuit, a specific configuration such as an arrangement of various power supply lines in the secondary semiconductor chip has not been studied in detail.

Accordingly, it is desired to provide a semiconductor device including various power supply lines, of which the specific configuration has been considered, in the secondary semiconductor chip.

Hereinafter, embodiments are specifically described with reference to the attached drawings. In the present specification and drawings, constituent elements having substantially the same functional configurations may be denoted by the same reference numerals, and duplicate explanations thereabout are omitted. In the following description, two directions parallel to the surface of a substrate and orthogonal to each other are defined as the X direction and the Y direction, and a direction perpendicular to the surface of the substrate is defined as the Z direction. In the present disclosure, an expression, "the position of any given element is the same as the position of another element", should not be strictly interpreted as excluding the elements being misaligned due to manufacturing variation, and it should be understood that even if the elements are misaligned due to such manufacturing variation, the positions of such elements may be considered to be the same as each other.

First Embodiment

First, the first embodiment is explained. FIG. 1 is a cross-sectional view illustrating a semiconductor device according to the first embodiment.

As illustrated in FIG. 1, the semiconductor device according to the first embodiment includes a first semiconductor chip 10 and a second semiconductor chip 20.

For example, the first semiconductor chip 10 includes a substrate 11 and a wiring layer 12. For example, the substrate 11 is a silicon substrate, and a semiconductor element such as a transistor is formed on the front surface side of the substrate 11. For example, the transistor is a FinFET including a source, a drain, and a channel in a fin 13. The wiring layer 12 is formed on the surface of the substrate 11, and includes a conductive trace 14 and an insulating layer 15. A part of the conductive trace 14 is connected to the fin 13. Further, for example, a power supply line 16 connected to the conductive trace 14 is formed on the front surface side of the substrate 11, and a via 17 connected from the power supply line 16 to the back surface of the substrate 11 is provided in the substrate 11. For example, the via 17 is a through-silicon via (TSV). As illustrated in FIG. 1, a portion of the conductive trace 14 may have a shape similar to a via to be connected to the power supply line 16.

The second semiconductor chip 20 is arranged to face the back surface of the substrate 11 of the first semiconductor chip 10. For example, the second semiconductor chip 20 includes a substrate 21, a wiring unit 22, and pads 23. For example, the substrate 21 is a silicon substrate. The wiring unit 22 is formed on the surface of the substrate 21, and includes a conductive trace 24 and an insulating layer 25. For example, the upper surface of the wiring unit 22 faces the back surface of the substrate 11 of the first semiconductor chip 10. In other words, the wiring unit 22 is located between the substrate 11 and the substrate 21. As illustrated in FIG. 1, the wiring unit 22 may include multiple layers of conductive traces 24. Multiple layers of conductive traces 24 may be connected through vias 28 provided in the wiring unit 22. For example, the pads 23 are external connection terminals for connection with a wiring substrate, a board, and the like. A portion of the conductive trace 24 is connected to the via 17. The pads 23 are provided on the back surface of the substrate 21, and vias 26 connecting the conductive traces 24 and the pads 23 are provided in the substrate 21. For example, the via 26 is a TSV.

In FIG. 1, in the plan view, the second semiconductor chip 20 is larger than the first semiconductor chip 10, but the second semiconductor chip 20 may have approximately the same size as the first semiconductor chip 10, and may have a size smaller than the first semiconductor chip 10. In the plan view, the pads 23 may be provided on the surface of the second semiconductor chip 20 facing the first semiconductor chip 10 at the outer side of the first semiconductor chip 10.

The cross-sectional view of FIG. 1 illustrates an overview of the semiconductor device, the detail of which is illustrated in FIG. 6 to FIG. 8, FIG. 10 to FIG. 12, and FIG. 14 to FIG. 16.

Figure 2:
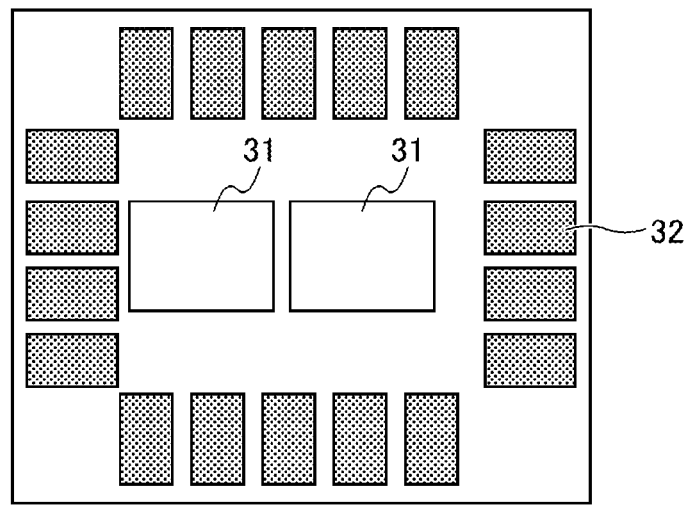
FIG. 2 is a drawing illustrating a layout of the first semiconductor chip according to the first embodiment.
Figure 3:
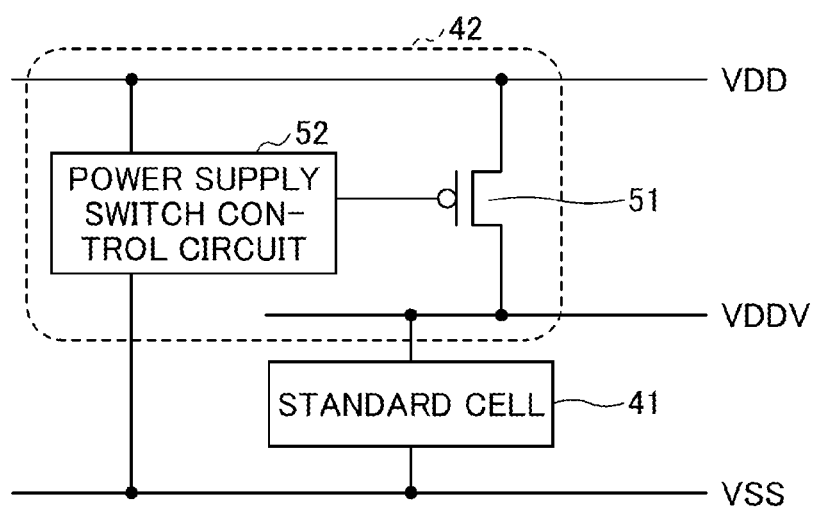
FIG. 3 is a circuit diagram illustrating a power supply switch circuit according to the first embodiment.

Next, the first semiconductor chip 10 is explained. FIG. 2 is a drawing illustrating a layout of the first semiconductor chip 10. FIG. 3 is a circuit diagram illustrating a power supply switch circuit included in the first semiconductor chip 10.

As illustrated in FIG. 2, the first semiconductor chip 10 includes multiple standard cell areas 31 and input-and-output (I/O) cell areas 32 arranged around the standard cell areas 31. Alternatively, a single standard cell area 31 may be provided, or three or more standard cell areas 31 may be provided. As illustrated in FIG. 3, the standard cell area 31 includes a standard cell 41 and a power supply switch circuit 42. For example, the standard cell 41 includes various kinds of logic circuits such as a NAND circuit, an inverter circuit, and the like. The standard cell area 31 is arranged with: a VSS line for supplying a ground potential to the standard cell 41; and a VDDV line for supplying a power supply potential to the standard cell 41. In addition, the standard cell area 31 is arranged with a VDD line for supplying a power supply potential to the power supply switch circuit 42 from outside.

As illustrated in FIG. 3, the power supply switch circuit 42 includes a switch transistor 51 and a power supply switch control circuit 52. For example, the switch transistor 51 is a P-channel MOS transistor, and is connected between the VDD line and the VDDV line. The power supply switch control circuit 52 is connected to the gate of the switch transistor 51 to control the operation of the switch transistor 51. The power supply switch control circuit 52 switches the ON/OFF state of the switch transistor 51 to control the conduction between the VDD line and the VDDV line. For example, the power supply switch control circuit 52 is a buffer.

Figure 4:
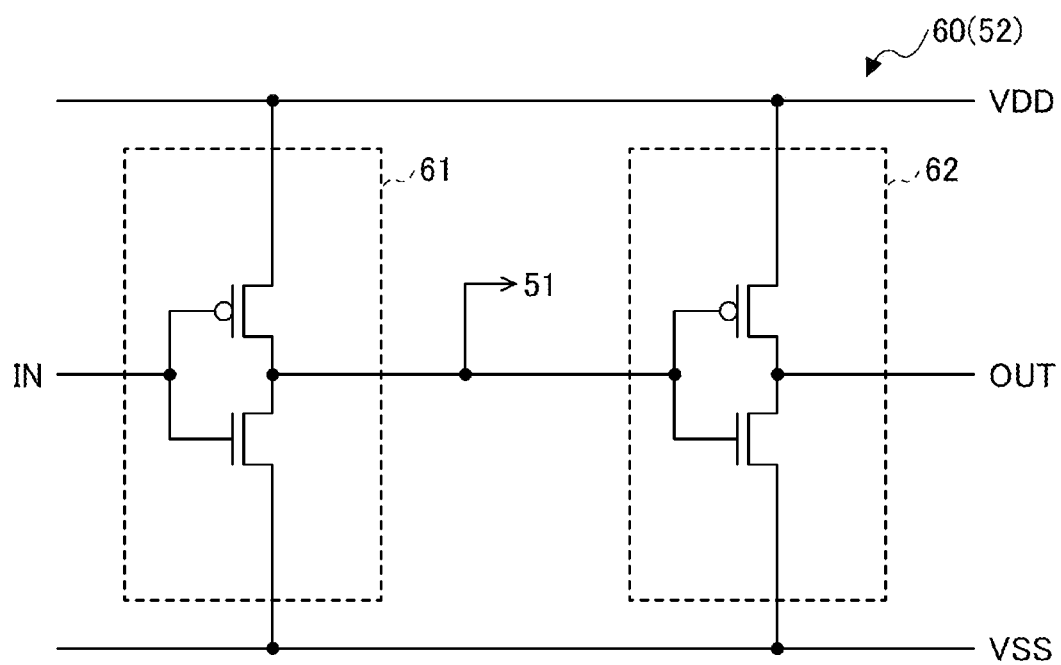
FIG. 4 is a circuit diagram illustrating a buffer.

Next, the configuration of the buffer used for the power supply switch control circuit 52 is explained. FIG. 4 is a circuit diagram illustrating a buffer.

As illustrated in FIG. 4, the buffer 60 used for the power supply switch control circuit 52 includes an inverter 61 and an inverter 62. The inverter 61 receives an input signal IN. The output of the inverter 61 is received by the gate of the switch transistor 51 and the inverter 62. The inverter 62 outputs an output signal OUT. Each of the inverters 61 and 62 includes a pair of transistors that are a P-channel MOS transistor and an N-channel MOS transistor. The configuration of the inverters 61 and 62 is merely an example. For example, two or more pairs of P-channel MOS transistor and N-channel MOS transistor may be included in each of the inverters 61 and 62.

Figure 5:
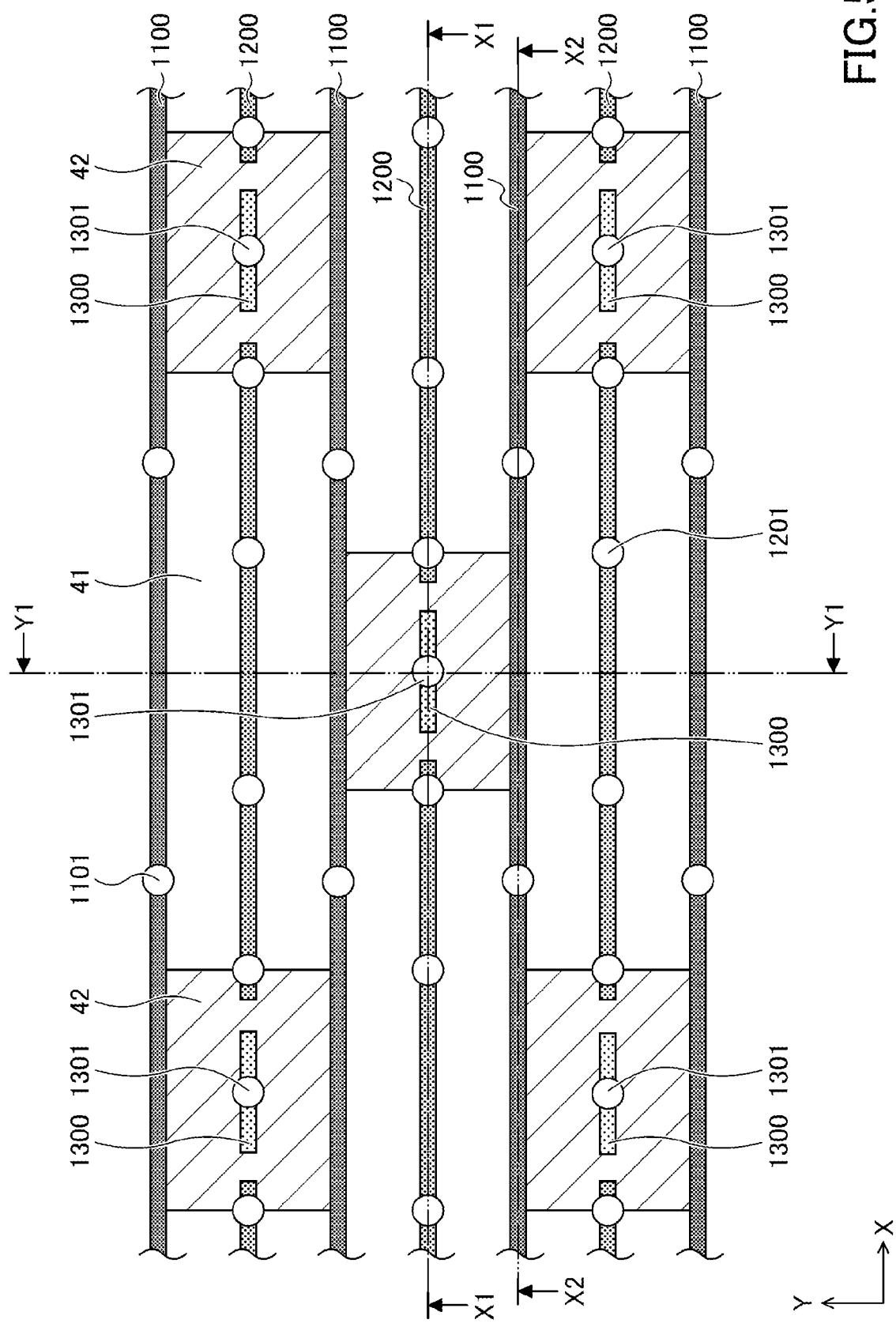
FIG. 5 is a plan view illustrating a configuration of a standard cell area according to the first embodiment.
Figure 6:
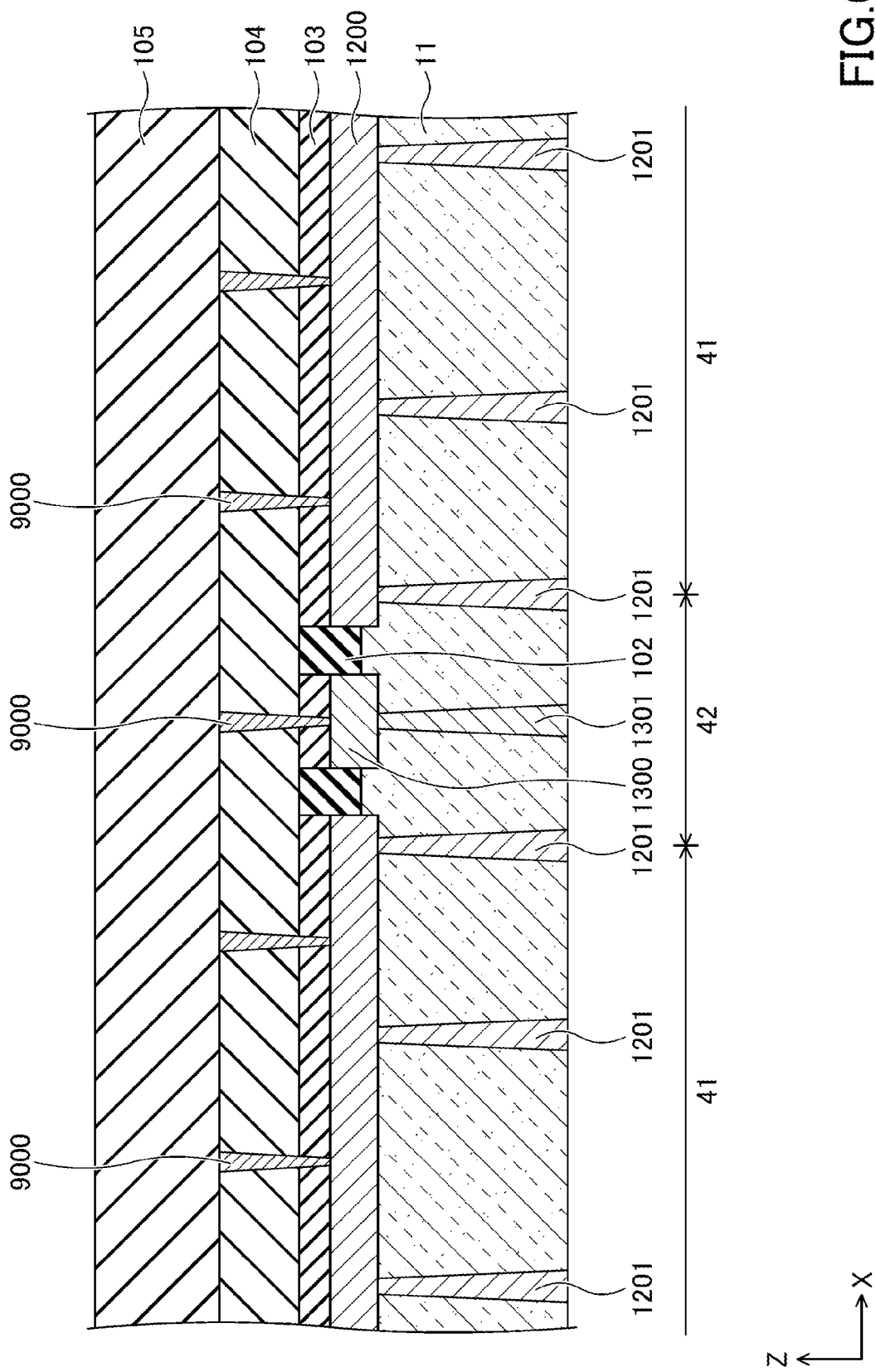
FIG. 6 is a cross-sectional view illustrating the standard cell area according to the first embodiment (Part 1)
Figure 7:
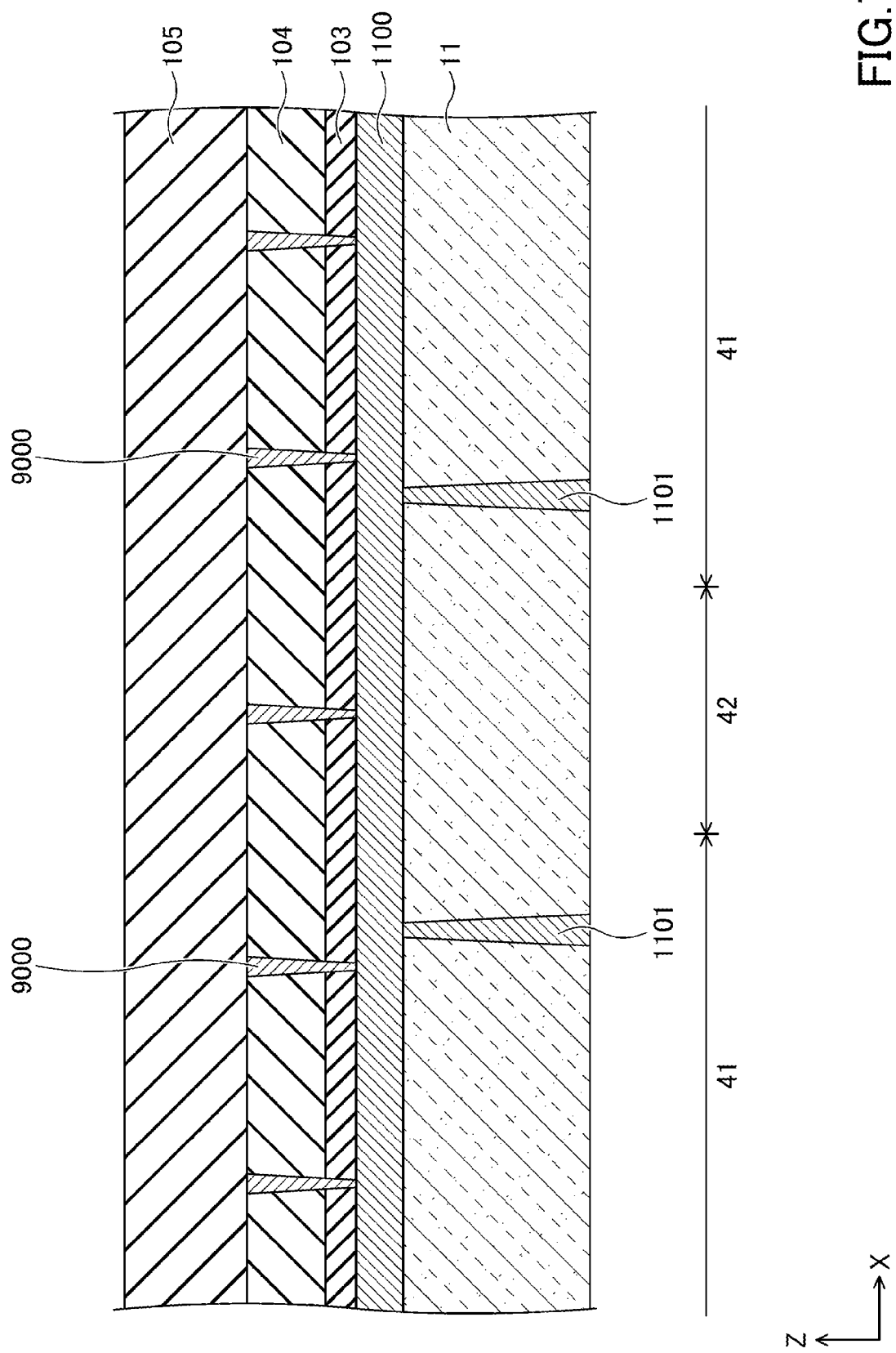
FIG. 7 is a cross-sectional view illustrating the standard cell area according to the first embodiment (Part 2)
Figure 8:
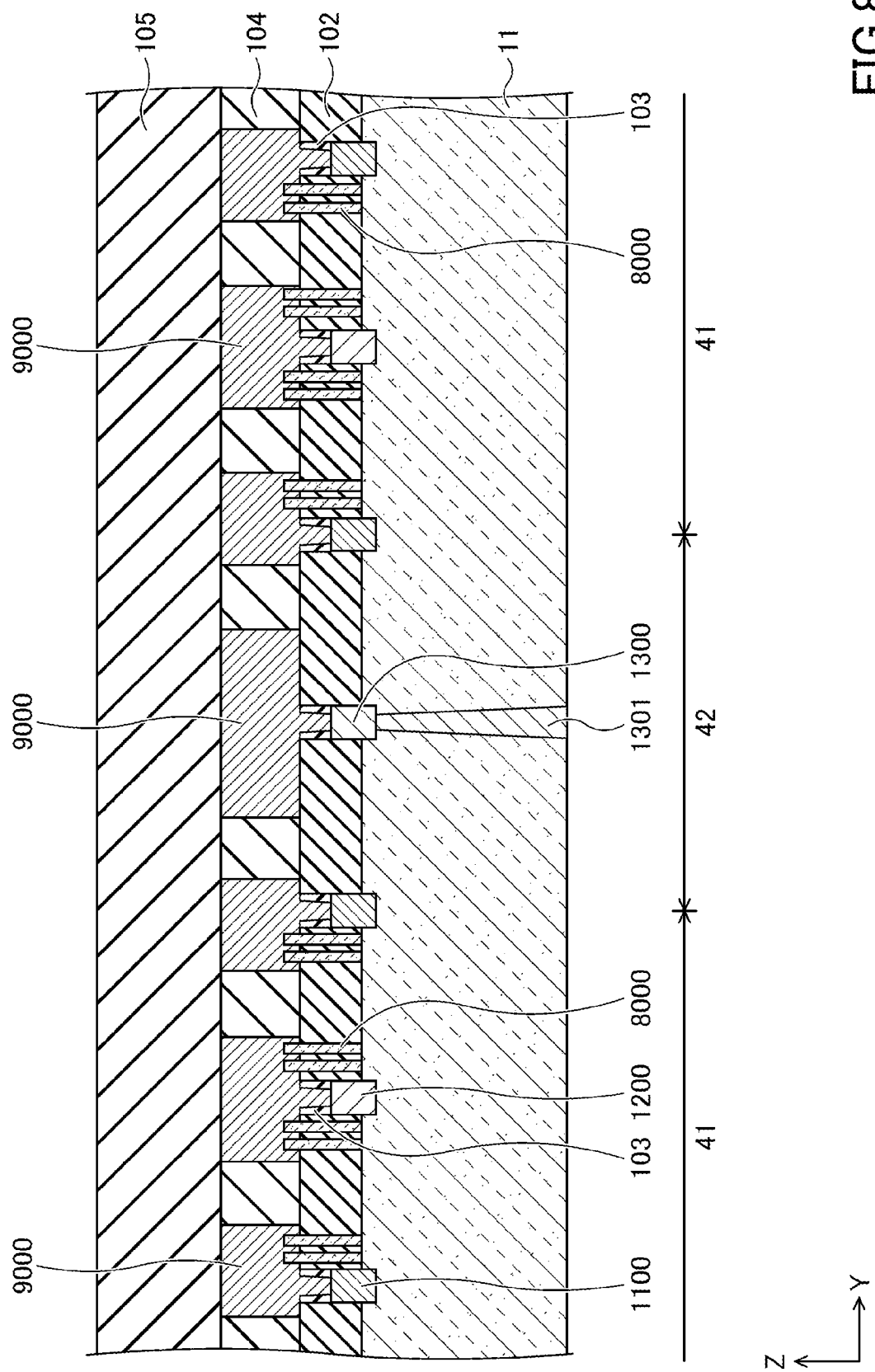
FIG. 8 is a cross-sectional view illustrating the standard cell area according to the first embodiment (Part 3)

Next, the structure of the standard cell area 31 is explained. FIG. 5 is a plan view illustrating a configuration of the standard cell area 31 according to the first embodiment. FIG. 6 to FIG. 8 are cross-sectional views illustrating the standard cell area 31 according to the first embodiment. FIG. 6 corresponds to a cross-sectional view taken along line X1-X1 of FIG. 5. FIG. 7 corresponds to a cross-sectional view taken along line X2-X2 of FIG. 5. FIG. 8 corresponds to a cross-sectional view taken along line Y1-Y1 of FIG. 5.

As illustrated in FIG. 5 to FIG. 8, in the standard cell area 31, power supply lines 1100 extending in the X direction and power supply lines 1200 extending in the X direction are arranged alternately in the Y direction. The power supply lines 1200 are mainly arranged in the standard cell 41. In the power supply switch circuit 42, power supply lines 1300 extending in the X direction are arranged. For example, the power supply line 1300 is arranged between two power supply lines 1100 adjacent to each other in the Y direction and between two power supply lines 1200 with the power supply switch circuit 42 interposed therebetween in the X direction, and is located at the same Y coordinate as the power supply lines 1200. For example, the power supply line 1100 corresponds to the VDDV line, the power supply line 1200 corresponds to the VSS line, and the power supply line 1300 corresponds to the VDD line.

As illustrated in FIG. 6 to FIG. 8, an element isolation film 102 is formed on the surface of the substrate 11. For example, the element isolation film 102 is formed by Shallow Trench Isolation (STI) process. On the substrate 11 and the element isolation film 102, multiple grooves extending in the X direction are formed, and the power supply lines 1100, 1200, and 1300 are formed in these grooves. For example, the surfaces of the power supply lines 1100, 1200, and 1300 are covered with an insulation film 103. For example, the surface of the element isolation film 102 and the surface of the insulation film 103 may be flush with the surface of the substrate 11, or do not have to be flush with the surface of the substrate 11. The power supply lines 1100, 1200, and 1300 having the above structure may be referred to as Buried Power Rail (BPR).

The insulation film 104 is formed on or above the substrate 11, and local conductive traces 9000 are formed in the insulation film 104. A portion of the local conductive trace 9000 is connected to the power supply line 1100, 1200, or 1300 via an opening portion formed in the insulation film 103. A portion of the local conductive trace 9000 is connected to a fin 8000. The fin 8000 is a portion of the fin 13, and the local conductive trace 9000 is a portion of the conductive trace 14.

The insulation film 105 is formed on the insulation film 104. In the insulation film 105, various conductive traces are formed. The insulation films 103, 104, and 105 are portions of the insulating layer 15.

In the substrate 11, vias 1101, 1201, and 1301 penetrating through the substrate 11 up to the back surface are formed. The vias 1101 are formed under the power supply line 1100, the vias 1201 are formed under the power supply line 1200, and the vias 1301 are formed under the power supply line 1300. Multiple vias 1101 are arranged on a straight line extending in the Y direction, multiple vias 1201 are arranged on a straight line extending in the Y direction, and multiple vias 1301 are arranged on a straight line extending in the Y direction. These straight lines are at different positions in the X direction. An insulation film is formed between the substrate 11 and each of the vias 1101, 1201, and 1301. The power supply lines 1100, 1200, and 1300 are portions of the power supply line 16, and the vias 1101, 1201, and 1301 are portions of the via 17.

Figure 9:
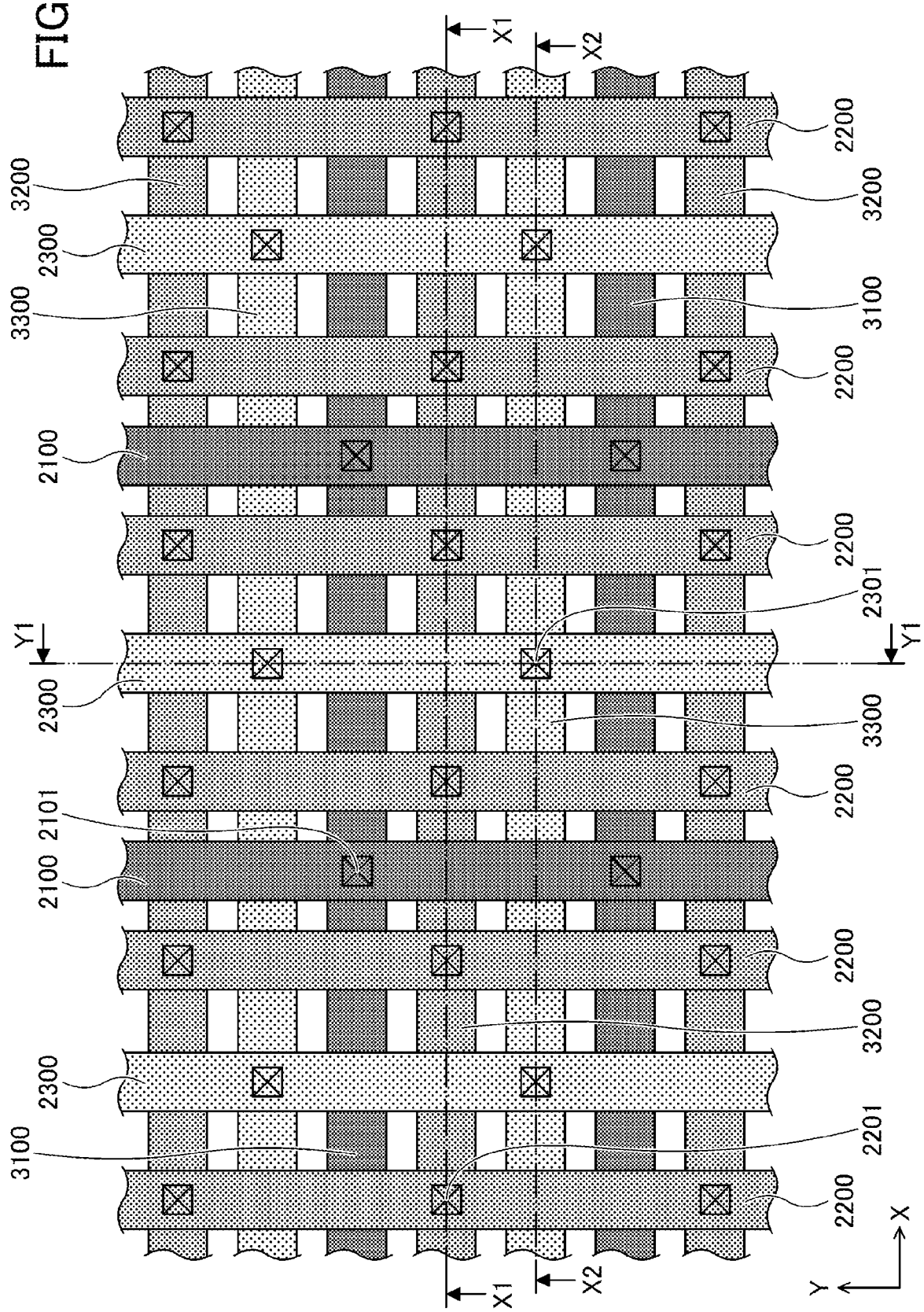
FIG. 9 is a plan view illustrating a configuration of a second semiconductor chip according to the first embodiment.
Figure 10:
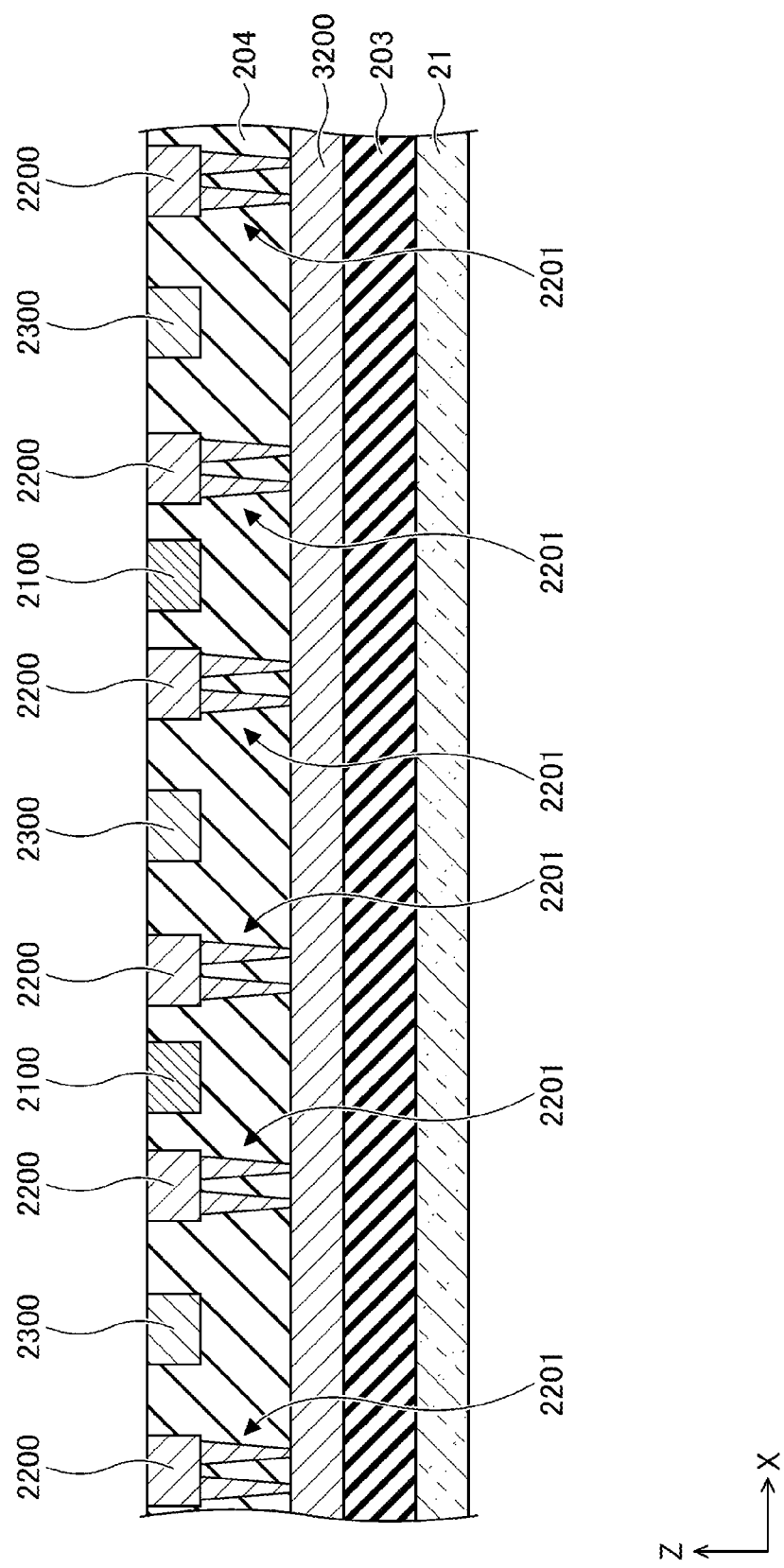
FIG. 10 is a cross-sectional view illustrating the second semiconductor chip according to the first embodiment (Part 1)
Figure 11:
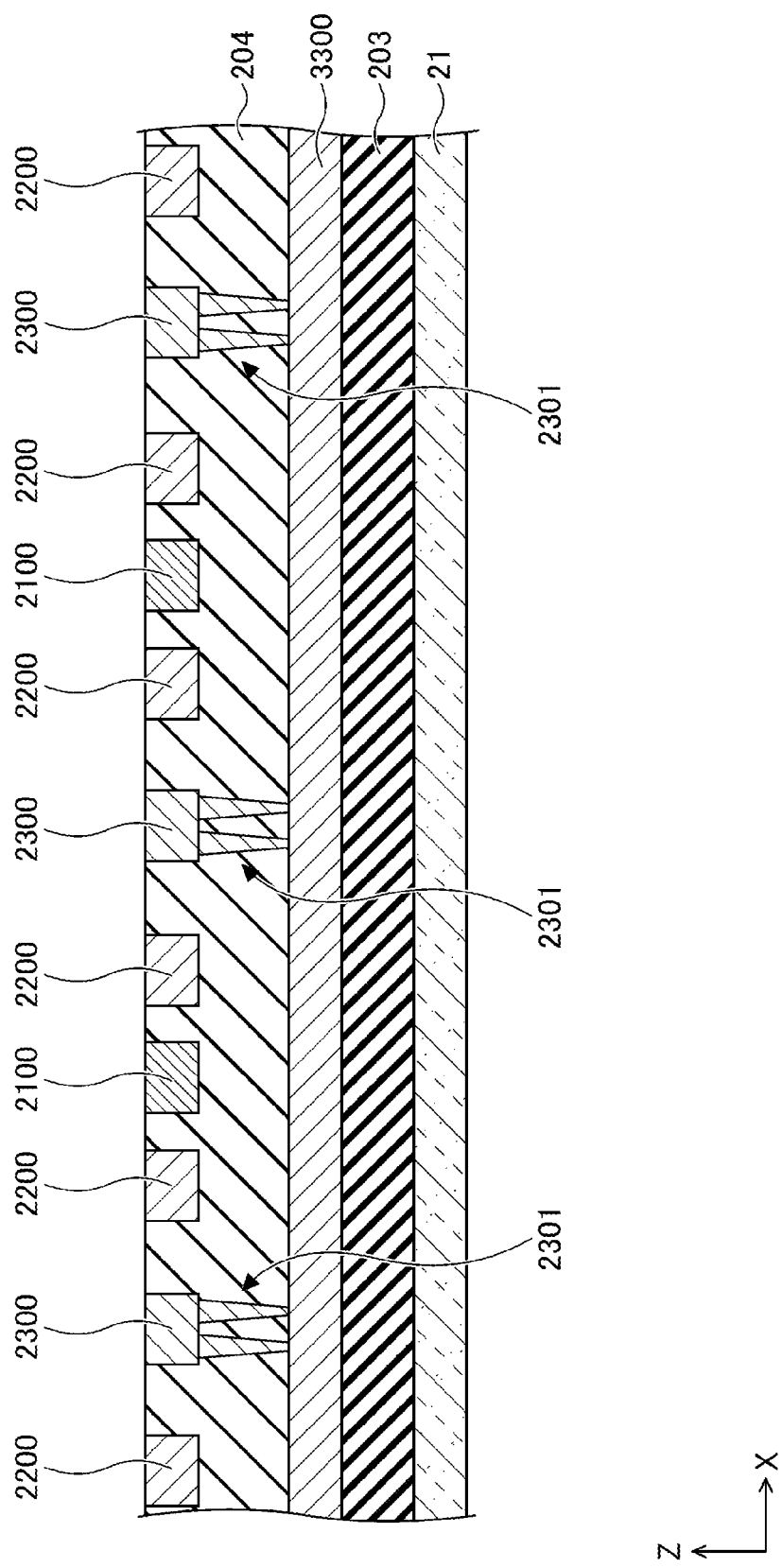
FIG. 11 is a cross-sectional view illustrating the second semiconductor chip according to the first embodiment (Part 2)
Figure 12:
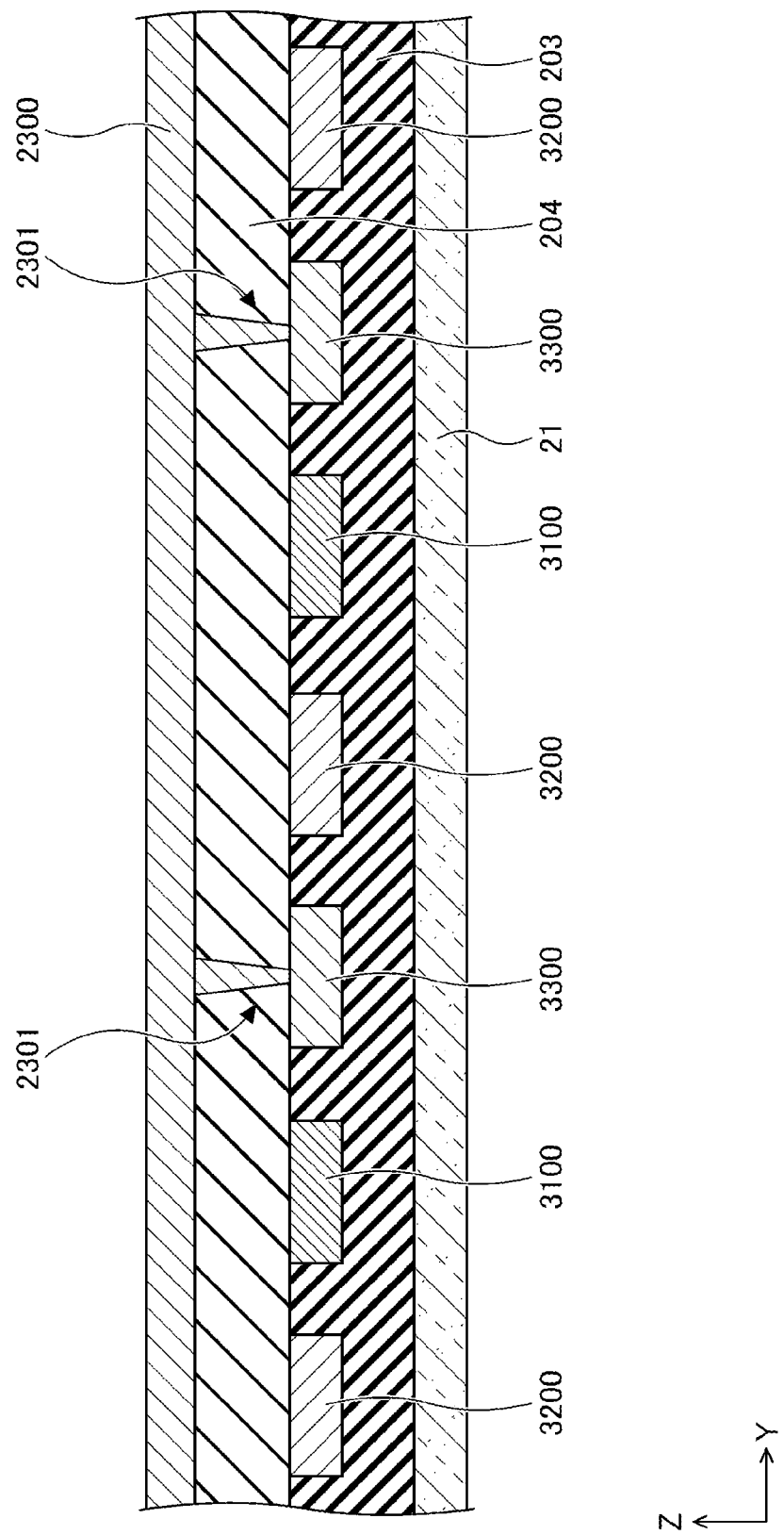
FIG. 12 is a cross-sectional view illustrating the second semiconductor chip according to the first embodiment (Part 3)

Next, the second semiconductor chip 20 is explained. FIG. 9 is a schematic view illustrating a configuration of the second semiconductor chip 20 according to the first embodiment in the plan view. FIG. 9 illustrates a portion overlapping with the portion illustrated in FIG. 5 in the plan view. FIG. 10 to FIG. 12 are cross-sectional views illustrating the second semiconductor chip 20 according to the first embodiment. FIG. 10 corresponds to a cross-sectional view taken along line X1-X1 of FIG. 9. FIG. 11 corresponds to a cross-sectional view taken along line X2-X2 of FIG. 9. FIG. 12 corresponds to a cross-sectional view taken along line Y1-Y1 of FIG. 9.

As illustrated in FIG. 9 to FIG. 12, the second semiconductor chip 20 includes, for example, an insulation film 203 formed on the substrate 21 and power supply lines 3100, 3200, and 3300 formed in a portion of the insulation film 203 close to its surface. The power supply lines 3100, 3200, and 3300 extend in the X direction. An insulation film 204 covering the power supply lines 3100, 3200, and 3300 are formed on the insulation film 203, and power supply lines 2100, 2200, and 2300 are formed in the insulation film 204. The power supply lines 2100, 2200, and 2300 extend in the Y direction. The upper surfaces of the power supply lines 2100, 2200, and 2300 are exposed from the insulation film 204. The power supply line 2100 is arranged at a position that overlaps with the straight line in which the multiple vias 1101 are arranged, the power supply line 2200 is arranged at a position that overlaps with the straight line in which the multiple vias 1201 are arranged, and the power supply line 2300 is arranged at a position that overlaps with the straight line in which the multiple vias 1301 are arranged. The power supply line 3100 is mutually connected to the power supply line 2100 through the via 2101 formed in the insulation film 204. The power supply line 3200 is mutually connected to the power supply line 2200 through the via 2201 formed in the insulation film 204. The power supply line 3300 is mutually connected to the power supply line 2300 through the via 2301 formed in the insulation film 204. The power supply lines 2100, 2200, 2300, 3100, 3200, and 3300 are portions of the conductive trace 24, and the vias 2101, 2201, and 2301 are portions of the via 28. The insulation film 204 is a portion of the insulating layer 25.

Although not illustrated in FIG. 9 to FIG. 12, a via connected to the power supply line 3200 and a via connected to the power supply line 3300 are formed in the insulation film 203 and the substrate 21, and pads connected to these vias are formed on the back surface of the substrate 21. These vias and pads are portions of the via 26 and the pad 23, respectively.

Figure 13:
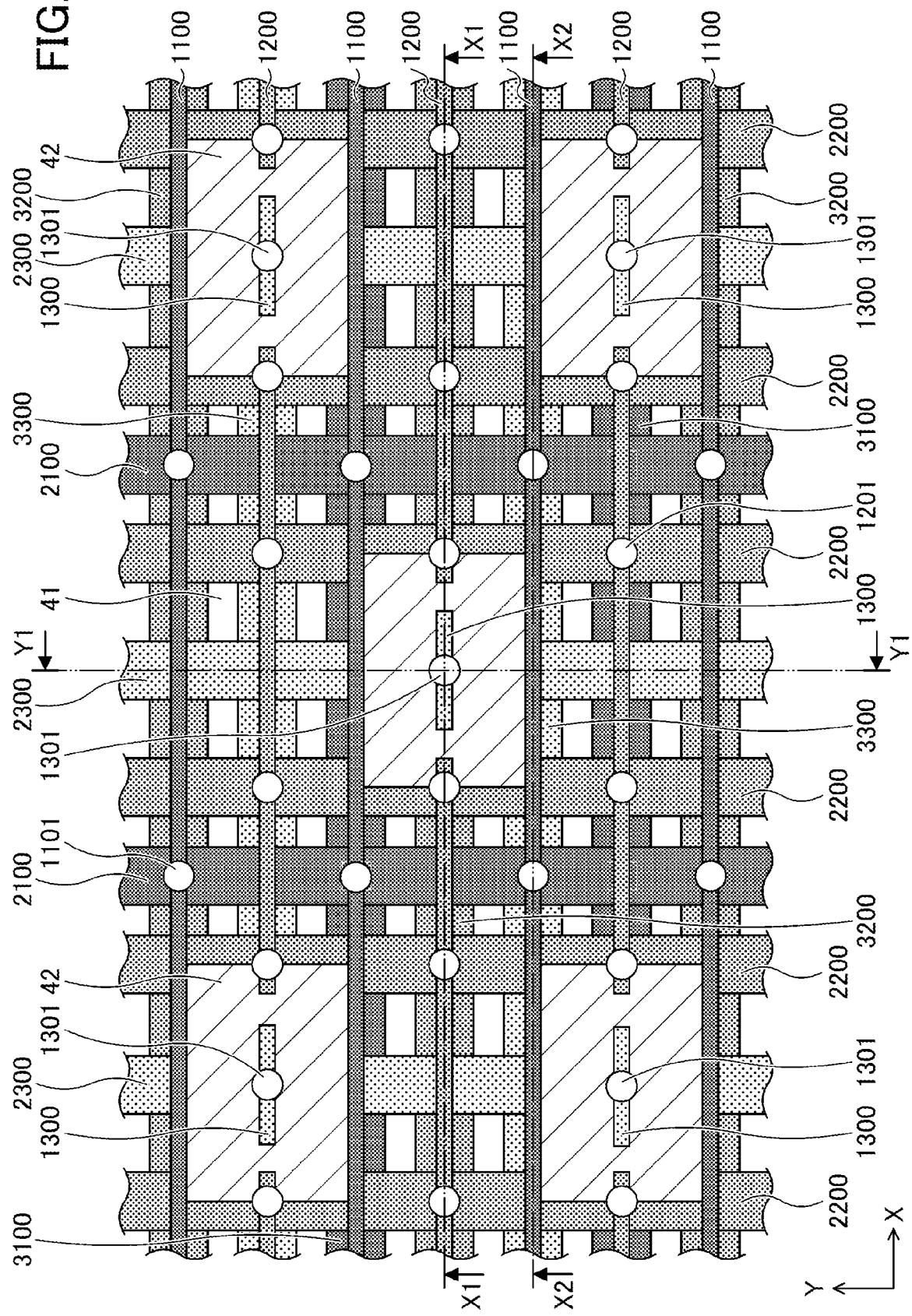
FIG. 13 is a plan view illustrating a configuration of the standard cell area and the second semiconductor chip according to the first embodiment.
Figure 14:
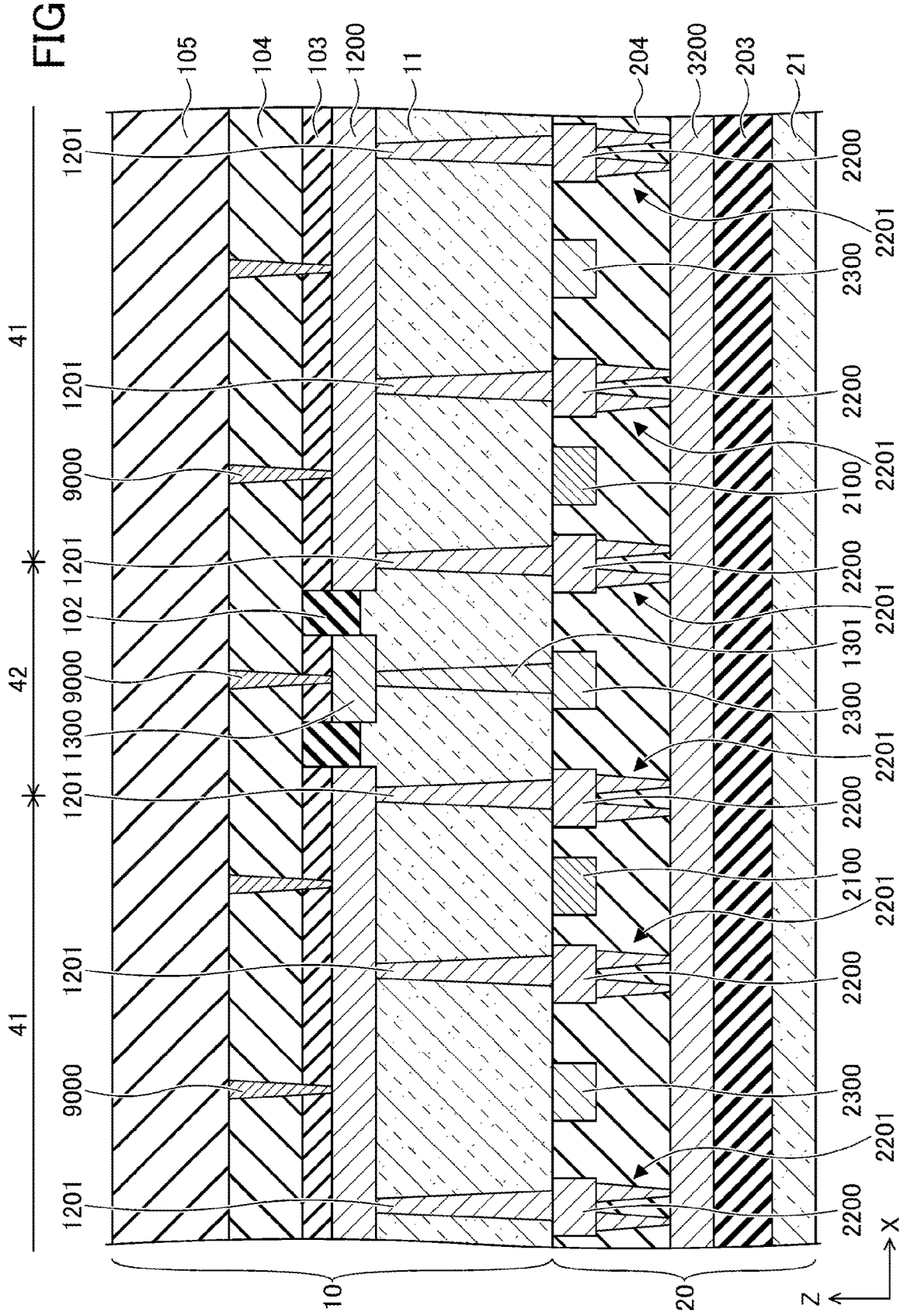
FIG. 14 is a cross-sectional view illustrating the standard cell area and the second semiconductor chip according to the first embodiment (Part 1)
Figure 15:
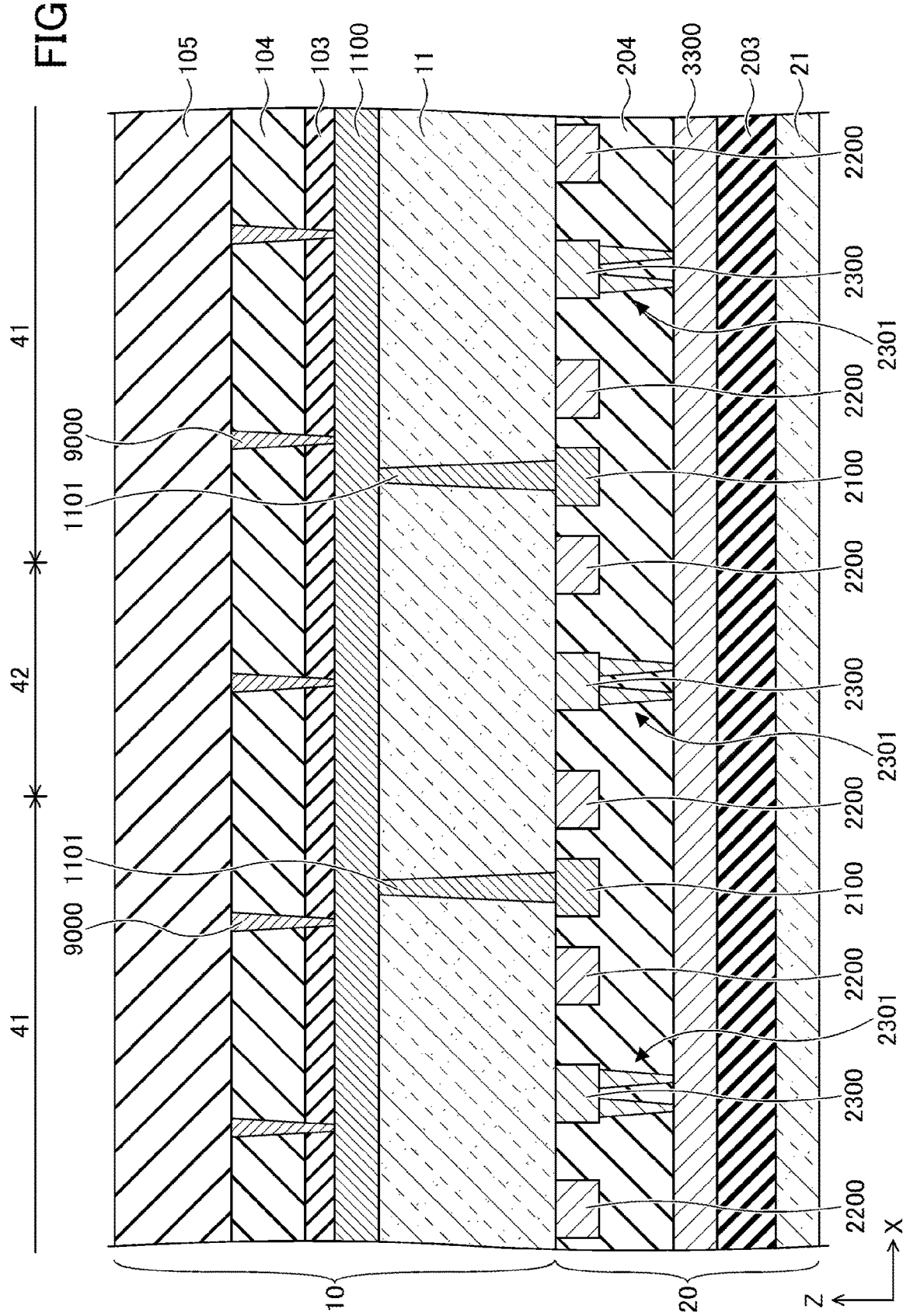
FIG. 15 is a cross-sectional view illustrating the standard cell area and the second semiconductor chip according to the first embodiment (Part 2)
Figure 16:
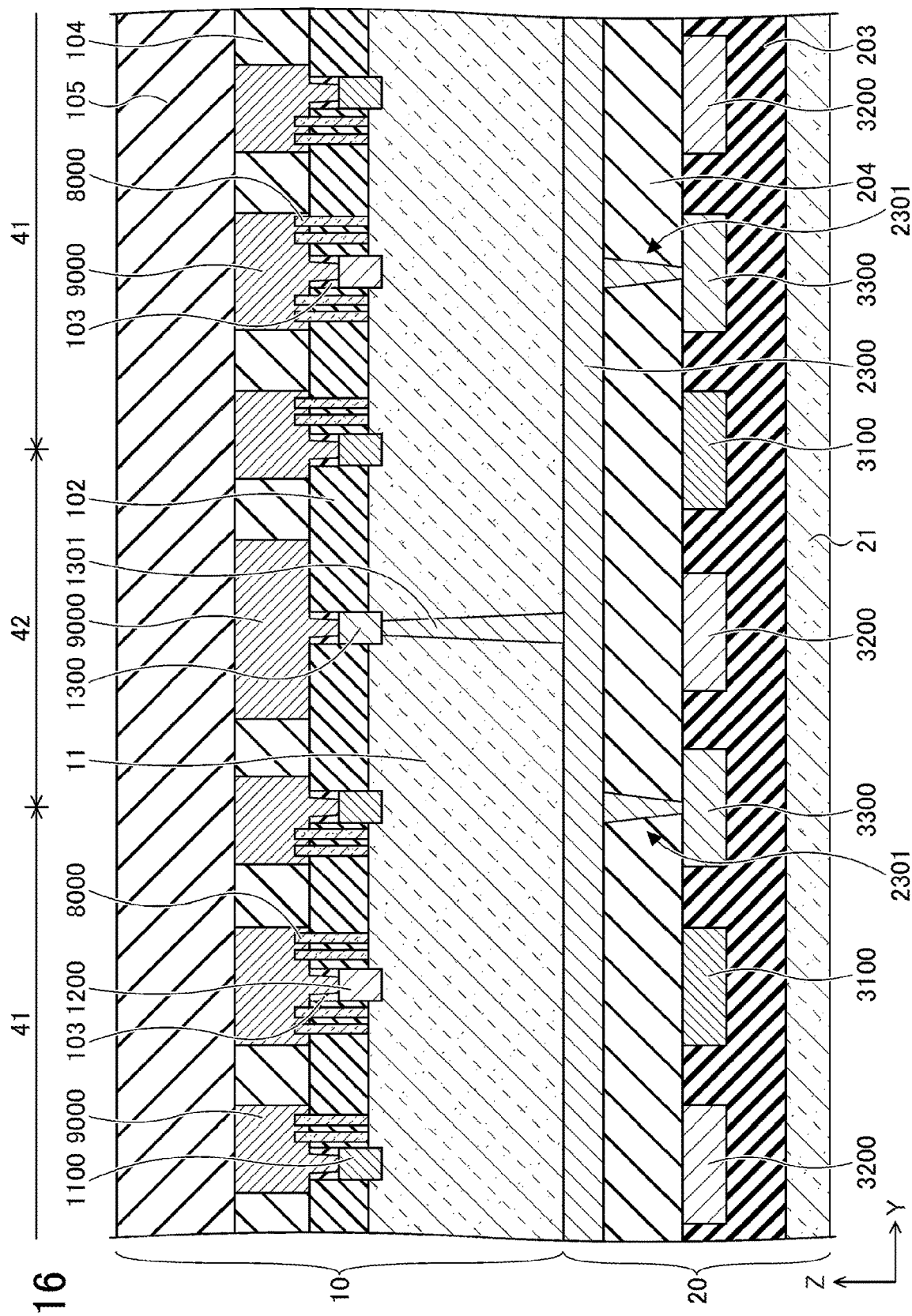
FIG. 16 is a cross-sectional view illustrating the standard cell area and the second semiconductor chip according to the first embodiment (Part 3)

The first semiconductor chip 10 is arranged on the second semiconductor chip 20 so that the portion illustrated in FIG. 5 to FIG. 8 in the standard cell area 31 and the portion illustrated in FIG. 9 to FIG. 12 in the second semiconductor chip 20 overlap with each other in the plan view. FIG. 13 is a plan view illustrating a configuration of the standard cell area 31 and the second semiconductor chip 20 according to the first embodiment. FIG. 14 to FIG. 16 are cross-sectional views illustrating the standard cell area 31 and the second semiconductor chip 20 according to the first embodiment. FIG. 14 corresponds to a cross-sectional view taken along line X1-X1 of FIG. 13. FIG. 15 corresponds to a cross-sectional view taken along line X2-X2 of FIG. 13. FIG. 16 corresponds to a cross-sectional view taken along line Y1-Y1 of FIG. 13.

As illustrated in FIG. 13 to FIG. 16, the via 1101 connected to the power supply line 1100 is connected to the power supply line 2100, the via 1201 connected to the power supply line 1200 is connected to the power supply line 2200, and the via 1301 connected to the power supply line 1300 is connected to the power supply line 2300. For example, the power supply lines 2100, 2200, 2300, 3100, 3200, and 3300 are wider and have lower resistances than the power supply lines 1100, 1200, and 1300. However, the widths of the power supply lines 2100, 2200, 2300, 3100, 3200, and 3300 may be the same as or narrower than the widths of the power supply lines 1100, 1200, and 1300.

The vias 1101, 1201, and 1301 do not have to be directly in contact with the power supply lines 2100, 2200, and 2300, and may be configured in any way so long as the vias 1101, 1201, and 1301 are electrically connected to the power supply lines 2100, 2200, and 2300. For example, a conductive material may be interposed between the vias 1101, 1201, and 1301 and the power supply lines 2100, 2200, and 2300.

Figure 17:
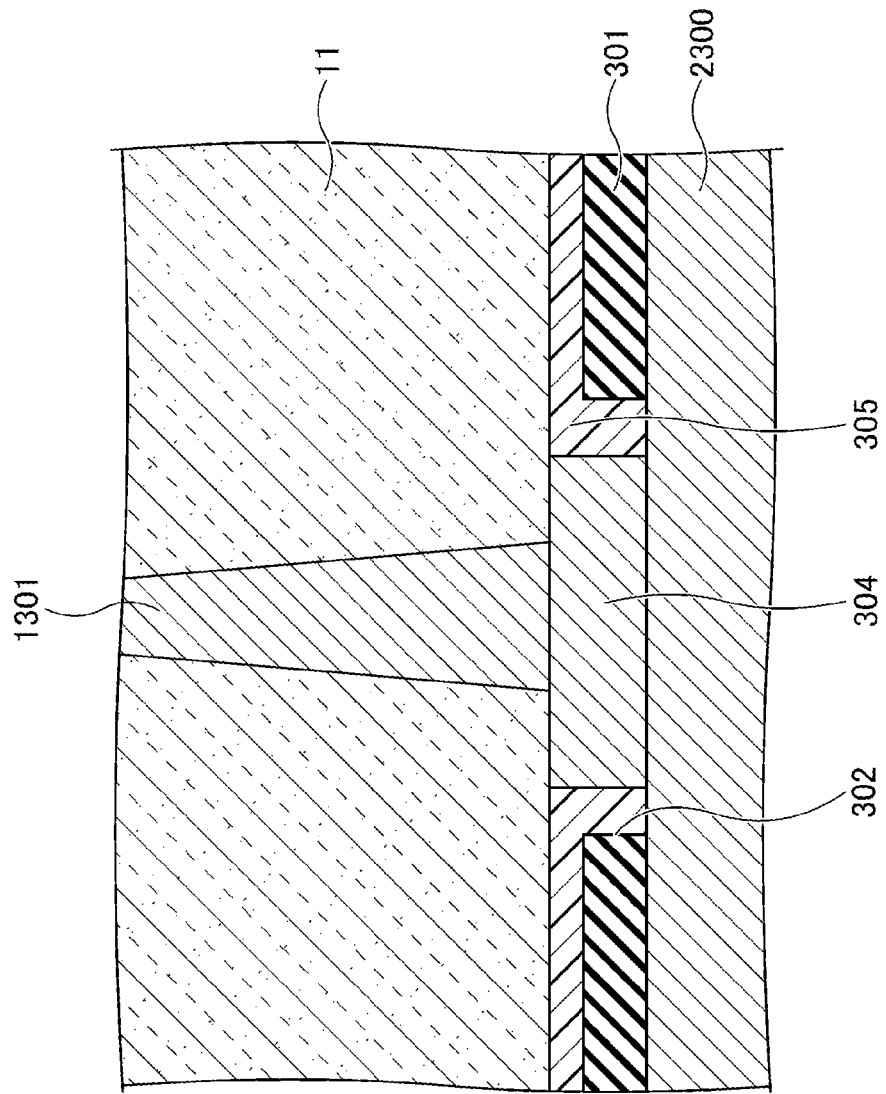
FIG. 17 is a cross-sectional view illustrating an example of a connection portion between a via of the first semiconductor chip and a signal line of the second semiconductor chip.

FIG. 17 is a cross-sectional view illustrating an example of a connection portion between the via 1301 and the power supply line 2300. For example, as illustrated in FIG. 17, the power supply line 2300 is covered with an insulation film 301, and an opening portion 302 is formed in the insulation film 301. In the inner side of the opening portion 302, the via 1301 and the power supply line 2300 may be electrically connected with each other via a bump 304. For example, the bump 304 is a micro bump such as a solder. For example, the insulation film 301 is a silicon oxide film, a silicon nitride film, or an organic insulation film. Before bonding, the bump 304 may be provided either on the via 1301 or on the power supply line 2300. For example, the first semiconductor chip 10 and the second semiconductor chip 20 may be bonded by an adhesive 305.

Instead of the bump 304, a metal film such as tin (Sn) may be used. A pad may be provided on the power supply line 2300 on the inner side of the opening portion 302. In this case, the bump 304 or the metal film may also be used for connection with the via 1301.

The above is also applicable to the connection between the via 1101 and the power supply line 2100 and to the connection between the via 1201 and the power supply line 2200.

The vias 1101, 1201, and 1301 of the first semiconductor chip 10 may protrude from the back surface of the substrate 11, and these protruding portions may be in contact with the power supply lines 2100, 2200, and 2300. A re-distribution layer may be provided on the back surface of the first semiconductor chip 10, and the positions of the vias 1101, 1201, and 1301 and the positions of the bonding portions of the power supply lines 2100, 2200, and 2300 may be configured to be different from each other in the plan view.

For example, the power supply lines 1100, 1200, and 1300 may be made of cobalt (Co), ruthenium (Ru), tungsten (W), or the like. For example, the power supply lines 2100, 2200, 2300, 3100, 3200, and 3300 are made of copper (Cu), aluminum (Al), tungsten (W), cobalt (Co), or the like. For example, conductive traces provided on or above the substrate 11 such as a first wiring layer or a second wiring layer are made of copper (Cu), aluminum (Al), tungsten (W), cobalt (Co), or the like.

Figure 18:
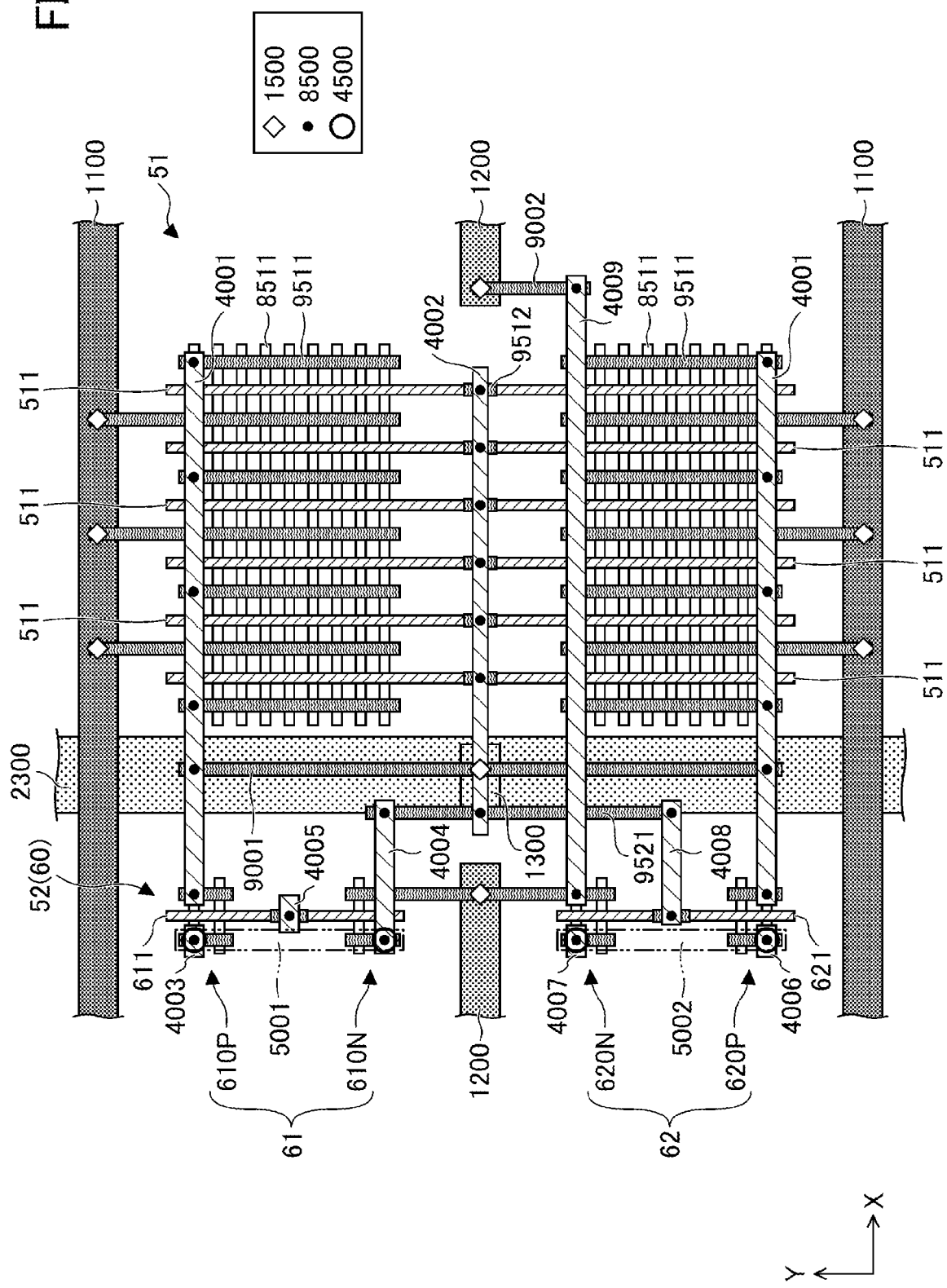
FIG. 18 is a plan view illustrating the power supply switch circuit according to the first embodiment (Part 1)
Figure 19:
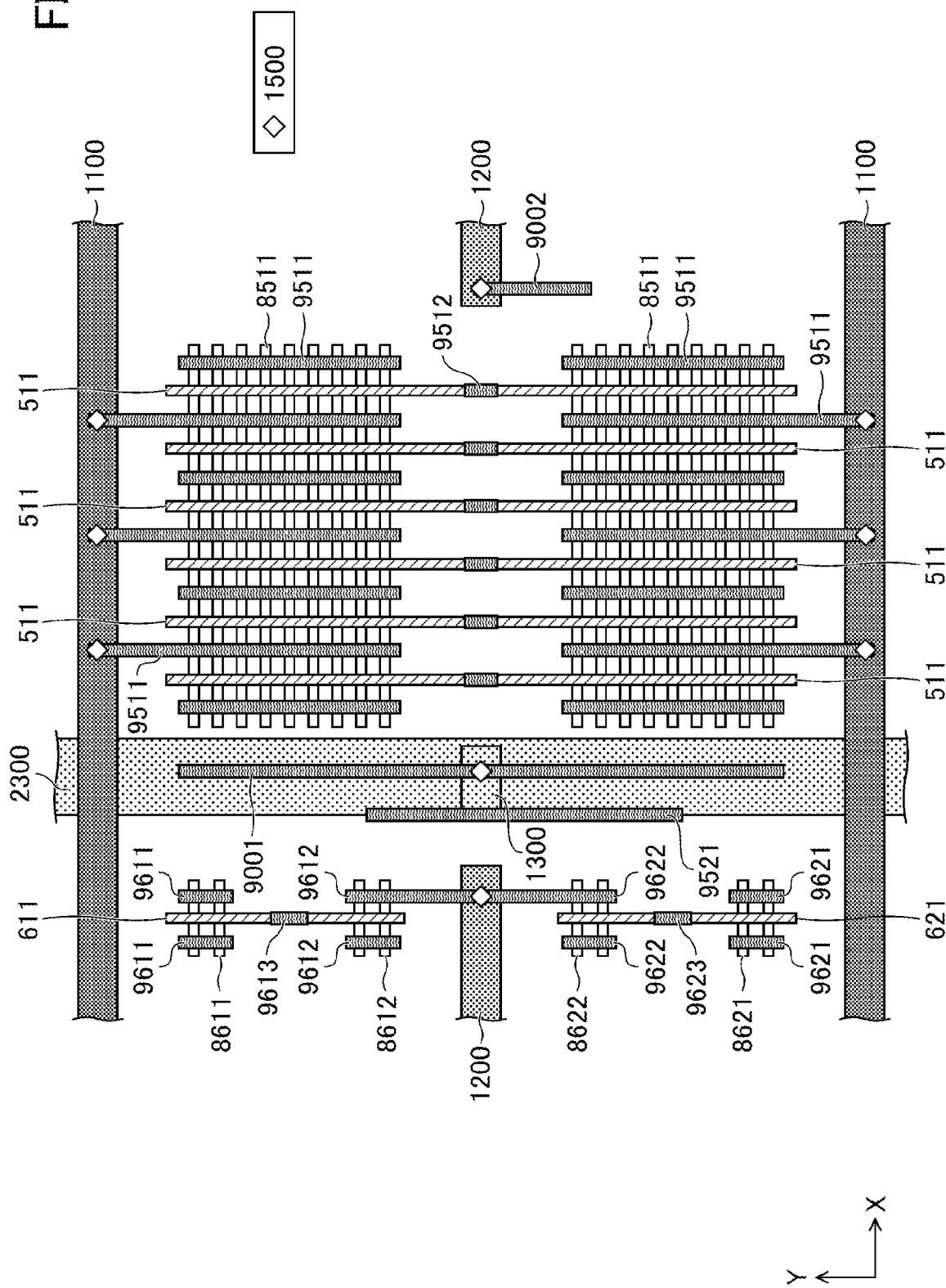
FIG. 19 is a plan view illustrating the power supply switch circuit according to the first embodiment (Part 2)
Figure 20:
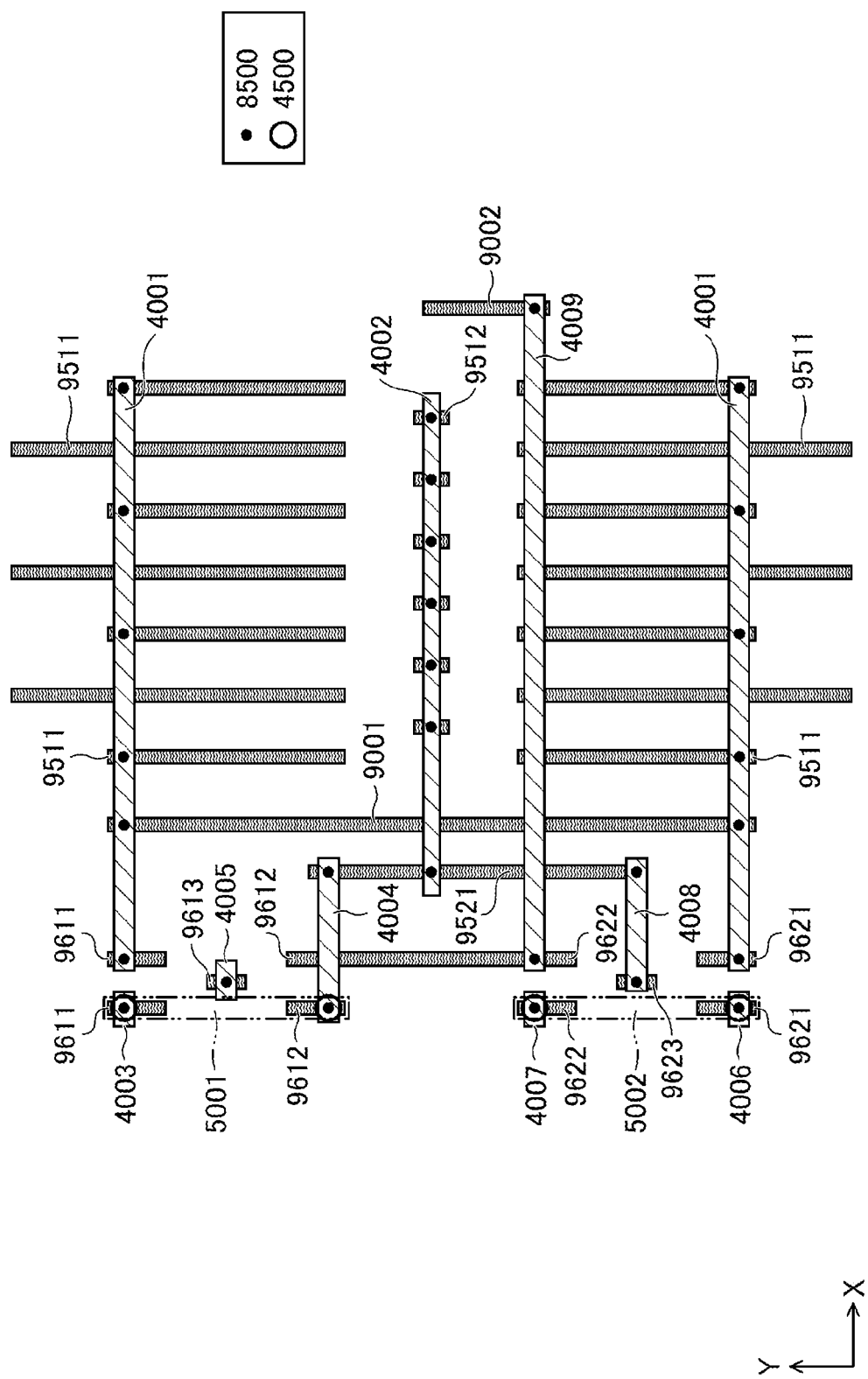
FIG. 20 is a plan view illustrating the power supply switch circuit according to the first embodiment (Part 3)

Next, the structure of the power supply switch circuit 42 according to the first embodiment is explained. FIG. 18 to FIG. 20 are schematic views illustrating the configuration of the power supply switch circuit 42 according to the first embodiment in the plan view. FIG. 18 mainly illustrates a layout of power supply lines, conductive traces, and gate electrodes. FIG. 19 mainly illustrates a layout of the gate electrodes and the power supply line. FIG. 20 mainly illustrates a layout of the first wiring layer and the second wiring layer.

As explained above, the power supply switch circuit 42 includes a switch transistor 51 and a power supply switch control circuit 52. The power supply switch circuit 42 includes multiple local conductive traces extending in the Y direction, multiple conductive traces extending in the X direction, and multiple conductive traces extending in the Y direction. For example, the local conductive traces are in contact with the fins or the gate electrodes of the transistor. For example, the conductive traces extending in the X direction are formed in the first wiring layer on or above the local conductive trace, and the conductive traces extending in the Y direction are formed in the second wiring layer on or above the first wiring layer. In the following explanation, a via 1500 is a via provided between the local conductive trace and the power supply line below the local conductive trace, a via 8500 is a via provided between the local conductive trace and the first wiring layer on or above the local conductive trace, and a via 4500 is a via provided between the first wiring layer and the second wiring layer on or above the first wiring layer.

The switch transistor 51 includes multiple gate electrodes 511 extending in the Y direction and arranged in the X direction. The switch transistor 51 further includes multiple fins 8511 extending in the X direction and arranged in the Y direction. For example, parts of the fins 8511 function as the source, some other parts of the fins 8511 function as the drain, and the remaining parts of the fins 8511 function as the channel. Multiple local conductive traces 9511 are arranged on both sides of the gate electrode 511. The local conductive traces 9511 are connected to the source or the drain. The local conductive trace 9511 connected to the source is connected to a conductive trace 4001 through the via 8500. The local conductive trace 9511 connected to the drain is connected to the power supply line 1100 through the via 1500. The gate electrode 511 is connected to a conductive trace 4002 through the local conductive trace 9512 and the via 8500. The conductive traces 4001 and 4002 extend in the X direction.

The power supply switch control circuit 52 includes the inverters 61 and 62. The inverter 61 includes a P-channel MOS transistor 610P and an N-channel MOS transistor 610N. The inverter 62 includes a P-channel MOS transistor 620P and an N-channel MOS transistor 620N.

The inverter 61 includes a gate electrode 611 extending in the Y direction for both of the P-channel MOS transistor 610P and the N-channel MOS transistor 610N. The gate electrode 611 is connected to the conductive trace 4005 through the local conductive trace 9613 and the via 8500. The conductive trace 4005 extends in the X direction. An input signal IN is input into the conductive trace 4005 (see FIG. 4).

The P-channel MOS transistor 610P includes multiple fins 8611 extending in the X direction and arranged in the Y direction. For example, some parts of the fins 8611 function as the source, some other parts of the fins 8611 function as the drain, and the remaining parts of the fins 8611 function as the channel. Local conductive traces 9611 are arranged on both sides of the gate electrode 611. The local conductive traces 9611 are connected to the source or the drain. The local conductive trace 9611 connected to the source is connected to the conductive trace 4001 through the via 8500. The local conductive trace 9611 connected to the drain is connected to a conductive trace 5001 through the via 8500, the conductive trace 4003, and the via 4500. The conductive trace 4003 extends in the X direction, and the conductive trace 5001 extends in the Y direction.

The N-channel MOS transistor 610N includes multiple fins 8612 extending in the X direction and arranged in the Y direction. For example, some parts of the fins 8612 function as the source, some other parts of the fins 8612 function as the drain, and the remaining parts of the fins 8612 function as the channel. Local conductive traces 9612 are arranged on both sides of the gate electrode 611. The local conductive trace 9612 is connected to the source or the drain. The local conductive trace 9612 connected to the source is connected to the power supply line 1200 through the via 1500. The local conductive trace 9612 connected to the drain is connected to the conductive trace 5001 through the via 8500, the conductive trace 4004, and the via 4500. The conductive trace 4004 extends in the X direction.

The inverter 62 includes a gate electrode 621 extending in the Y direction for both of the P-channel MOS transistor 620P and the N-channel MOS transistor 620N. The gate electrode 621 is connected to the conductive trace 4008 via the local conductive trace 9623 and the via 8500. The conductive trace 4008 extends in the X direction.

The P-channel MOS transistor 620P includes multiple fins 8621 extending in the X direction and arranged in the Y direction. For example, some parts of the fins 8621 function as the source, some other parts of the fins 8621 function as the drain, and the remaining parts of the fins 8621 function as the channel. Local conductive traces 9621 are arranged on both sides of the gate electrode 621. The local conductive traces 9621 are connected to the source or the drain. The local conductive trace 9621 connected to the source is connected to the conductive trace 4001 through the via 8500. The local conductive trace 9621 connected to the drain is connected to a conductive trace 5002 through the via 8500, a conductive trace 4006, and the via 4500. The conductive trace 4006 extends in the X direction, and the conductive trace 5002 extends in the Y direction.

The N-channel MOS transistor 620N includes multiple fins 8622 extending in the X direction and arranged in the Y direction. For example, some parts of the fins 8622 function as the source, some other parts of the fins 8622 function as the drain, and the remaining parts of the fins 8622 function as the channel. Local conductive traces 9622 are arranged on both sides of the gate electrode 621. The local conductive trace 9622 is connected to the source or the drain. The local conductive trace 9622 connected to the source is connected to the power supply line 1200 through the via 1500. The local conductive trace 9622 connected to the drain is connected to the conductive trace 5002 via the via 8500, a conductive trace 4007, and the via 4500. The conductive trace 4007 extends in the X direction. An output signal OUT is output from the conductive trace 5002 (see FIG. 4).

The conductive traces 4004 and 4008 are connected to the conductive trace 4002 through the vias 8500, a local conductive trace 9521, and the via 8500.

A local conductive trace 9001 connected to the conductive trace 4001 through the via 8500 is provided. The local conductive trace 9001 is connected to the power supply line 1300 through the via 1500. The power supply line 1300 is connected to the power supply line 2300 of the second semiconductor chip 20 through the via 1301. Therefore, a power supply potential of the VDD line is supplied to the conductive trace 4001. In FIG. 18 to FIG. 20, although the via 1301 is not illustrated, for example, the via 1301 is arranged at a position where the power supply line 1300 and the power supply line 2300 overlap with each other in the plan view.

A local conductive trace 9002 is provided so that the switch transistor 51 is interposed between the local conductive trace 9002 and the local conductive trace 9622 in the X direction. The local conductive trace 9622 is connected to a conductive trace 4009 through the via 8500. The conductive trace 4009 extends in the X direction. The local conductive trace 9002 is also connected to the conductive trace 4009 through the via 8500. The local conductive trace 9002 is connected to the power supply line 1200 through the via 1500. Therefore, two power supply lines 1200, between which the power supply switch circuit 42 is interposed in the X direction, are connected with each other through the conductive trace 4009 in the first semiconductor chip 10.

In the first embodiment, the power supply lines 1100, 1200, and 1300 in the first semiconductor chip 10 extend in the X direction, and are connected to the power supply lines 2100, 2200, and 2300, respectively, extending in the Y direction in the second semiconductor chip 20. The power supply lines 2100, 2200, and 2300 are connected to the power supply lines 3100, 3200, and 3300, respectively, extending in the X direction in the second semiconductor chip 20. Therefore, in the first embodiment, a power supply network is constituted with respect to each of the VDDV line, the VDD line, and the VSS line. Therefore, this can alleviate changes in the power supply potential provided to the standard cell 41 and the power supply switch circuit 42. In addition, because the power supply lines 2100, 2200, and 2300 are provided in the second semiconductor chip 20, the degree of flexibility in the arrangement of the conductive traces can be improved. In particular, because the power supply lines 1100, 1200, and 1300 are BPRs, the degree of flexibility in the arrangement of other conductive traces provided in the first wiring layer and the second wiring layer can be improved.

Further, the via 1301, which is the source for supplying the power supply potential of VDD to the switch transistor 51 and the power supply switch control circuit 52 of the power supply switch circuit 42, is located, in the plan view, between the switch transistor 51 and the power supply switch control circuit 52. Therefore, it is easy to arrange the conductive traces for supplying the power supply potential of VDD to the switch transistor 51 and the conductive traces for supplying the power supply potential of VDD to the power supply switch control circuit 52.

The power supply line (for example, the power supply lines 2100, 2200, and 2300) arranged in the second semiconductor chip 20 at the side of the first semiconductor chip 10 may extend in the X direction, and the power supply line (for example, the power supply lines 3100, 3200, and 3300) arranged in the second semiconductor chip 20 at the side away from the first semiconductor chip 10 may extend in the Y direction.

The shapes of the vias in the plan view are not particularly limited, and may be, for example, circular, elliptic, square, and rectangular shapes.

The size of the power supply switch circuit 42 is not particularly limited. In the example illustrated in FIG. 5 and the like, the power supply switch circuit 42 is arranged across two power supply lines 1100 in the Y direction, but, for example, the power supply switch circuit 42 may be arranged across three or four power supply lines 1100 in the Y direction.

Second Embodiment

Figure 21:
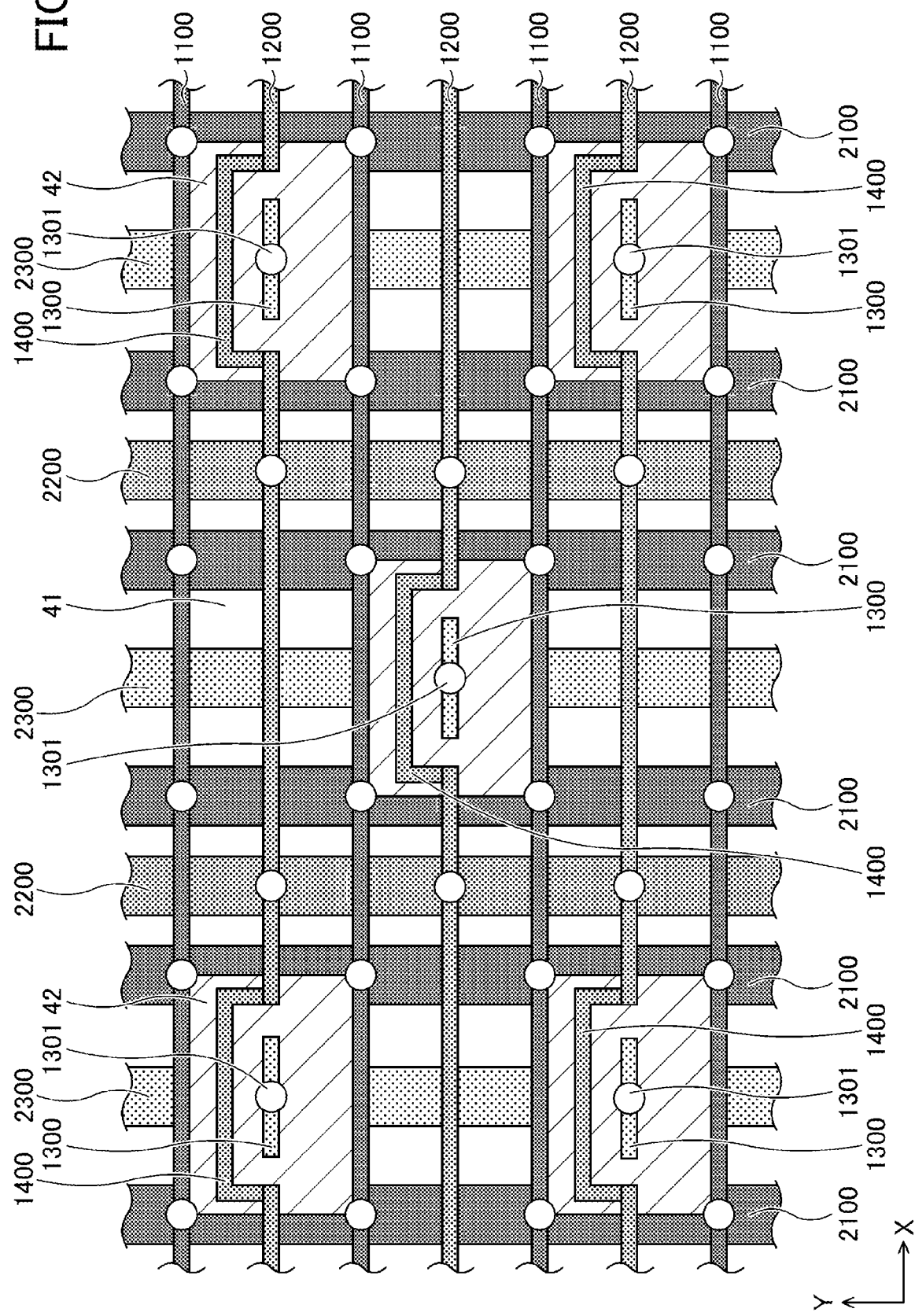
FIG. 21 is a plan view illustrating a configuration of a standard cell area and a second semiconductor chip according to a second embodiment.

Next, the second embodiment is explained. The second embodiment is different from the first embodiment in, e.g., the arrangement of the power supply lines in the power supply switch circuit 42. FIG. 21 is a plan view illustrating a configuration of a standard cell area 31 and a second semiconductor chip 20 according to the second embodiment.

As illustrated in FIG. 21, in the second embodiment, a power supply switch circuit 42 is provided with a connection power supply line 1400 that connects two power supply lines 1200 between which the power supply switch circuit 42 is interposed in the X direction. Similarly with the power supply lines 1100, 1200, and 1300, the connection power supply line 1400 is formed in a groove formed in the substrate 11 and the element isolation film 102, and the surface of the connection power supply line 1400 is covered with the insulation film 103. In other words, the connection power supply line 1400 is also a BPR.

In the first embodiment, the power supply line 2200 connected to the power supply line 1200 is adjacent to the power supply switch circuit 42 in the plan view, but in the second embodiment, the power supply line 2200 is arranged away from the power supply switch circuit 42. In the second embodiment, the power supply line 2100 is arranged adjacent to the power supply switch circuit 42 in the plan view.

The configuration other than the above is similar to the first embodiment.

According to the second embodiment, effects similar to the effects of the first embodiment can be obtained. In the second embodiment, in the first semiconductor chip 10, the power supply line 1200 is connected in the X direction through the connection power supply line 1400, and accordingly, the power supply network of the VSS line is constituted by the power supply lines 1200 and 2200 and the connection power supply line 1400. Therefore, the power supply line 3200 can be omitted. For this reason, the degree of flexibility in the arrangement of the power supply lines 2100, 3100, 3300 can be improved. The power supply line 3100 may also be omitted.

The connection power supply line 1400 does not have to be a BPR, and may be provided in a wiring layer on or above the substrate 11, such as the first wiring layer. In this case, a portion of the connection power supply line 1400 may be arranged to overlap with the power supply line 1300 in the plan view.

Third Embodiment

Figure 22:
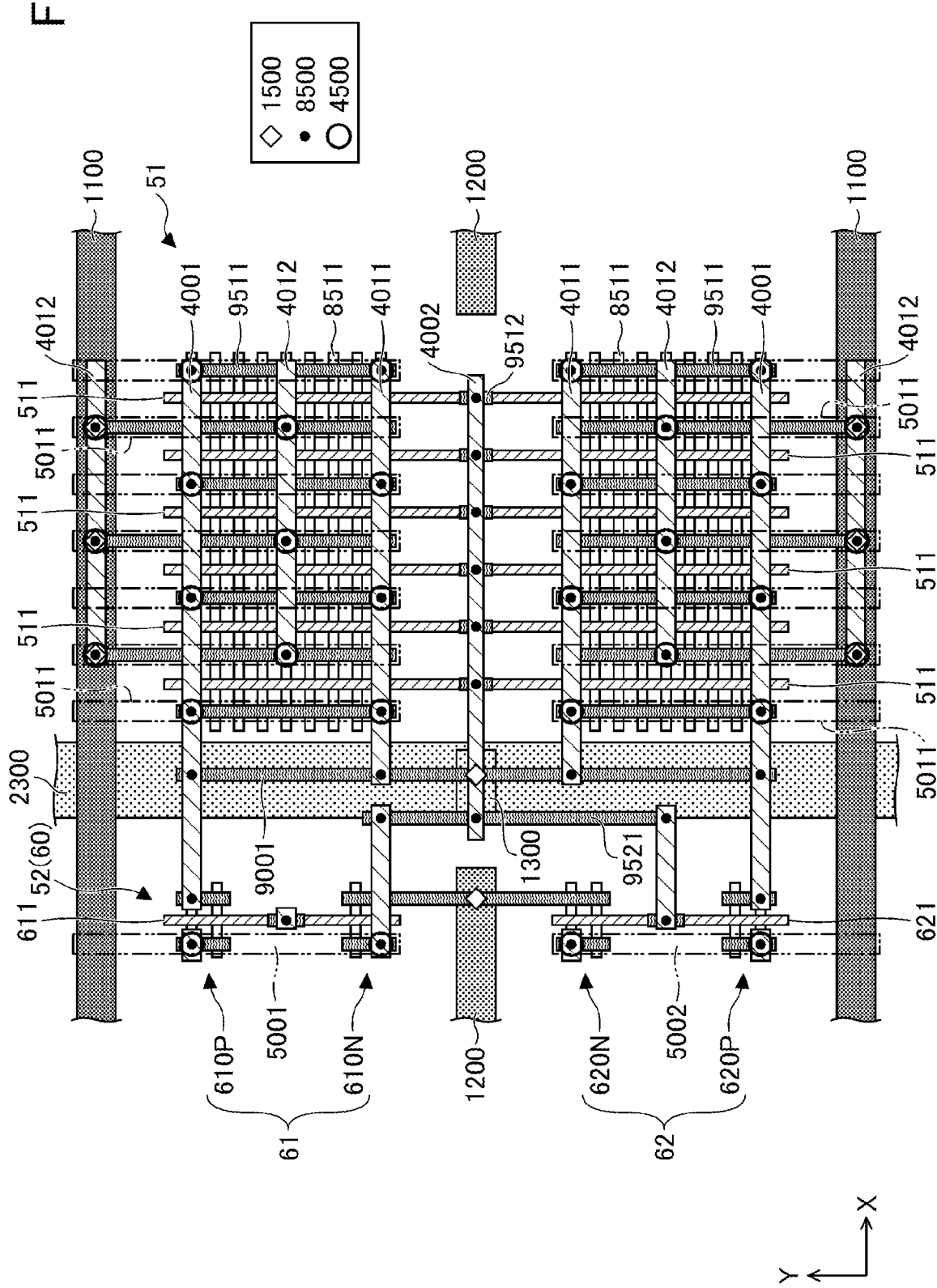
FIG. 22 is a plan view illustrating a power supply switch circuit according to a third embodiment (Part 1)
Figure 23:
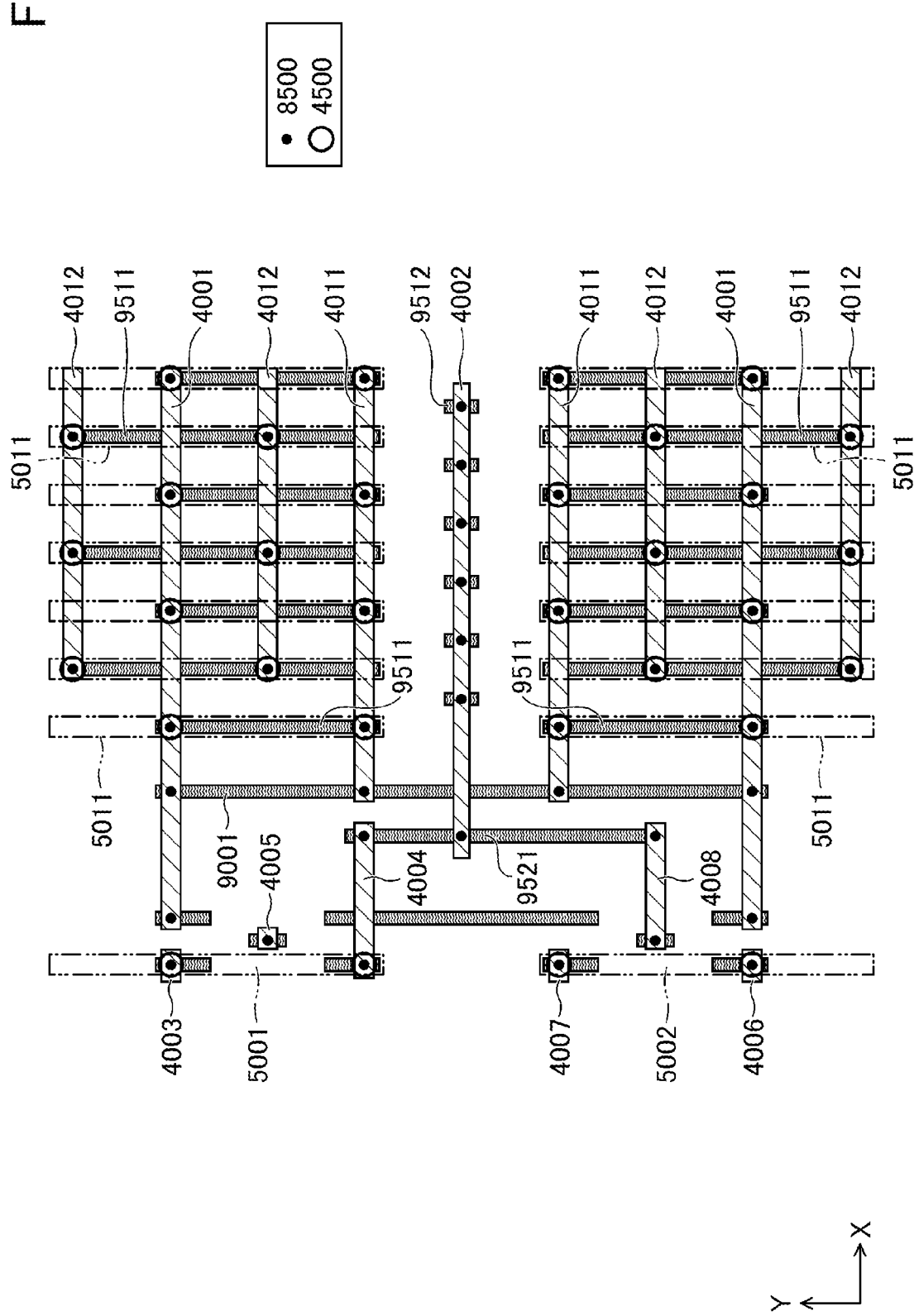
FIG. 23 is a plan view illustrating the power supply switch circuit according to the third embodiment (Part 2)

Next, the third embodiment is explained. The third embodiment is different from the first embodiment in the configuration of the power supply switch circuit 42 in the plan view. FIG. 22 to FIG. 23 are plan views illustrating a configuration of the power supply switch circuit 42 according to the third embodiment. FIG. 22 mainly illustrates a layout of power supply lines, conductive traces, and gate electrodes. FIG. 23 mainly illustrates a layout of a first wiring layer and a second wiring layer.

As illustrated in FIG. 22 and FIG. 23, in the third embodiment, conductive traces 4011 and 4012 extending in the X direction are provided in the power supply switch circuit 42. The conductive trace 4011 is connected to the source of the switch transistor 51 through a local conductive trace 9511, and the conductive trace 4012 is connected to the drain of the switch transistor 51 through another local conductive trace 9511. In the Y direction, the conductive trace 4011 is arranged between the conductive trace 4001 and the conductive trace 4002, and the conductive trace 4012 is arranged between the conductive trace 4001 and the conductive trace 4011. The conductive trace 4011 is connected to the local conductive trace 9001 through the via 8500. The conductive traces 4011 and 4012 are formed in the first wiring layer. As illustrated in FIG. 22, the conductive trace 4002 may be arranged to overlap with the power supply line 1100 in the plan view.

The power supply switch circuit 42 is provided with multiple conductive traces 5011 extending in the Y direction. The conductive traces 5011 are arranged on or above the local conductive traces 9511, and are connected to the local conductive traces 9511 through the vias 4500 and the like. The conductive traces 5011 are formed in the second wiring layer.

The configuration other than the above is similar to the first embodiment.

In the third embodiment, when the switch transistor 51 is in the ON state, not only the local conductive trace 9511 but also the conductive trace 5011 serve as the current path. As a result, the conductive trace resistance decreases. Accordingly, electro migration (EM) and IR drop (i.e., voltage drop due to resistance) can be alleviated.

In particular, the conductive trace 4012 is connected to the drain of the switch transistor 51, and the conductive trace 4011 is connected to the source of the switch transistor 51. Therefore, the supply of the power supply potential can be furthermore strengthened.

The end positions of the multiple conductive traces 5011 are preferably the same as each other. This is because, in the production process, the pattern can be uniformized, and the adverse effect caused by variation in the sizes can be alleviated. The end positions in the Y direction of the conductive traces 5001 and 5002 in the power supply switch control circuit 52 may be the same as the end positions in the Y direction of the conductive traces 5011. However, these end positions in the Y direction do not have to be the same.

Fourth Embodiment

Figure 24:
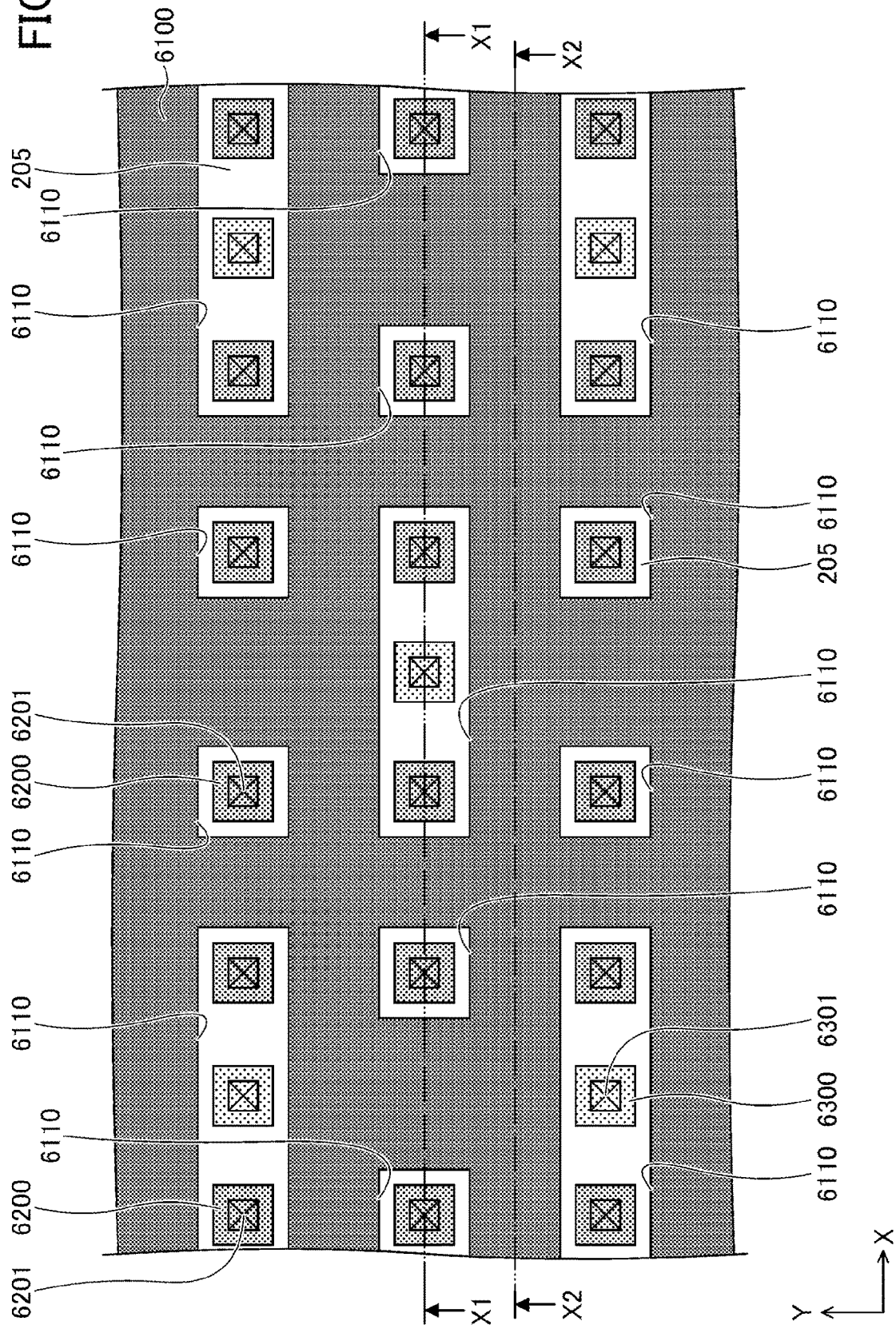
FIG. 24 is a plan view illustrating a second semiconductor chip according to a fourth embodiment (Part 1)
Figure 25:
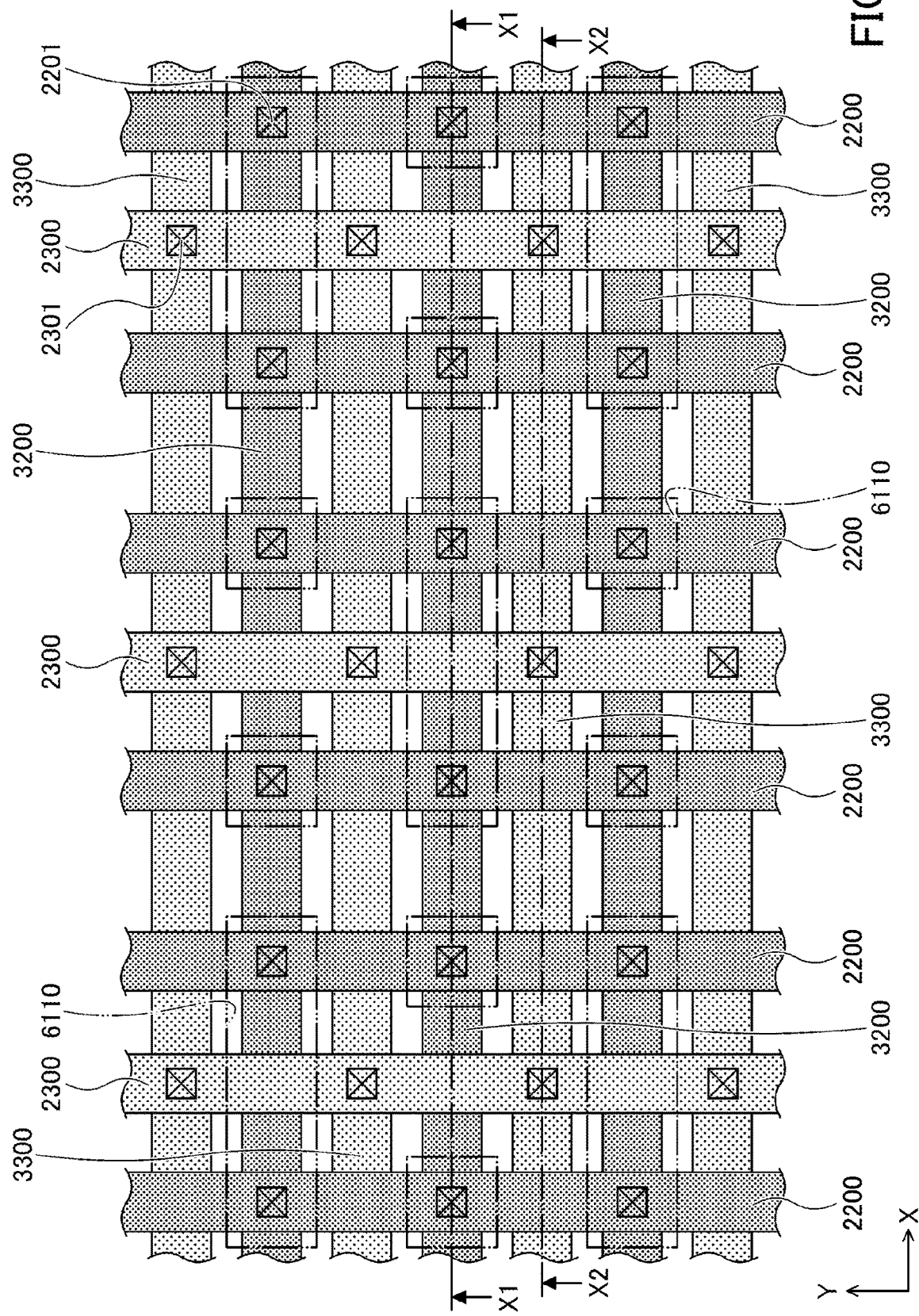
FIG. 25 is a plan view illustrating the second semiconductor chip according to the fourth embodiment (Part 2)
Figure 26:
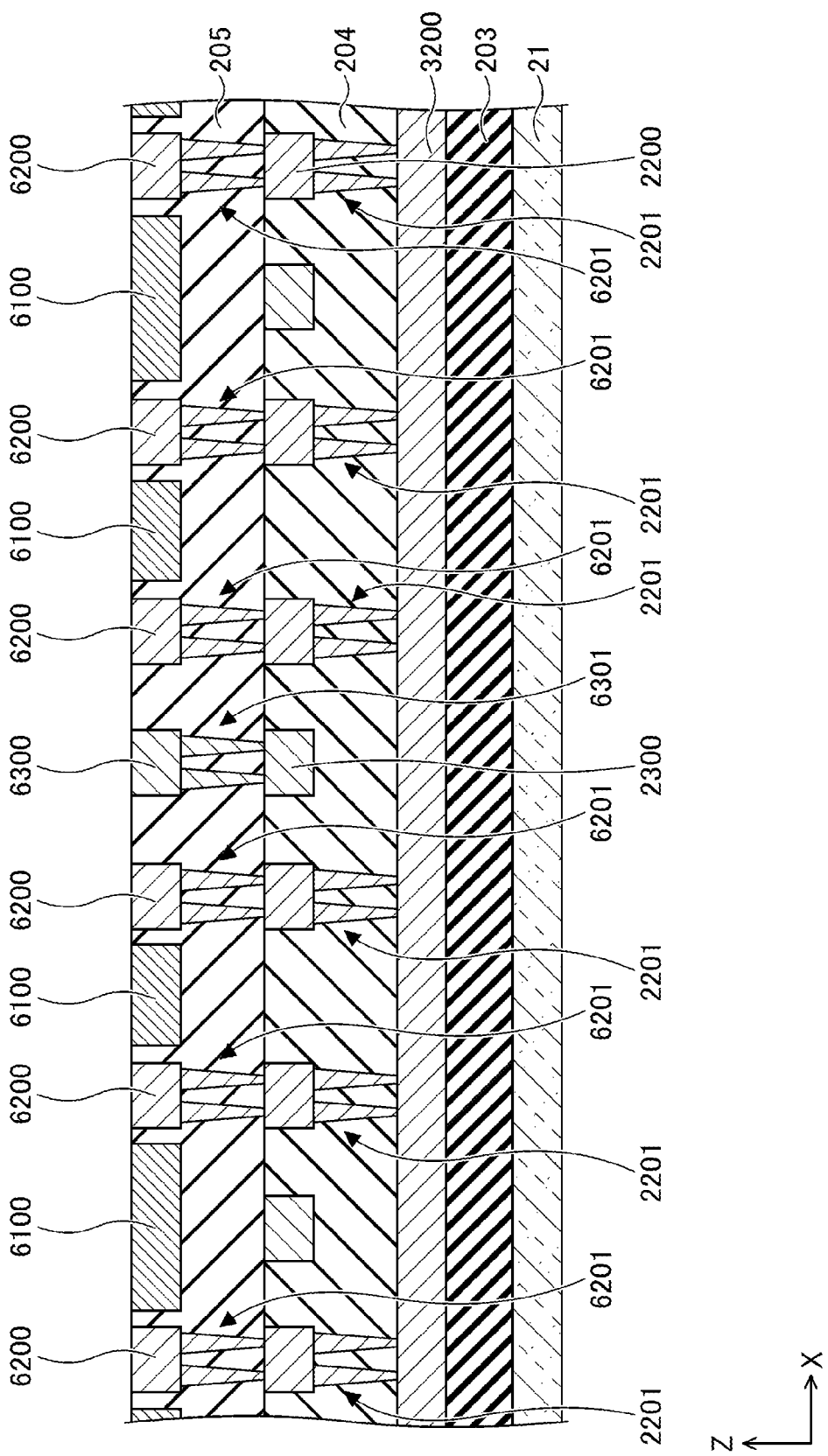
FIG. 26 is a cross-sectional view illustrating the second semiconductor chip according to the fourth embodiment (Part 1)
Figure 27:
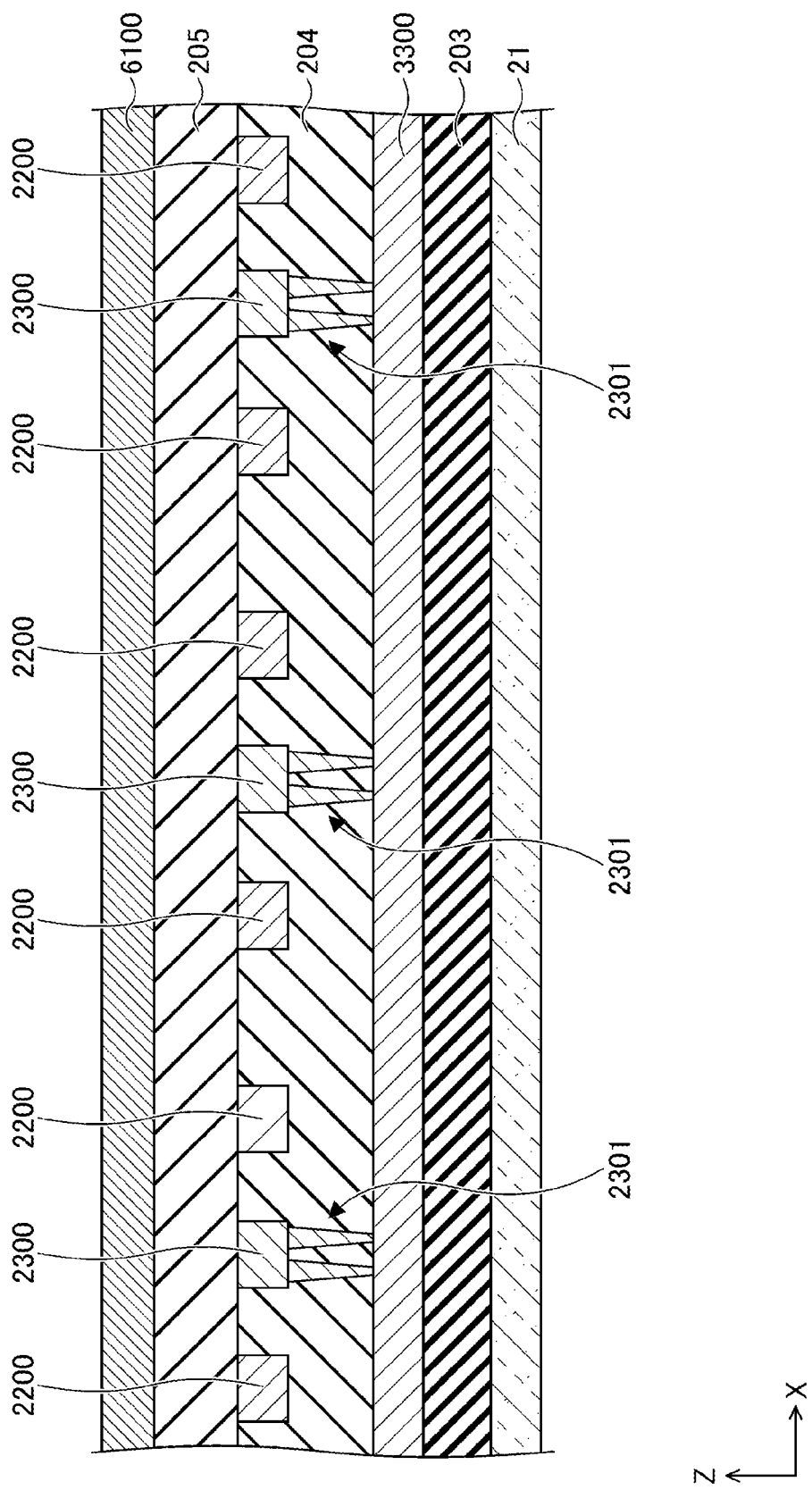
FIG. 27 is a cross-sectional view illustrating the second semiconductor chip according to the fourth embodiment (Part 2)
Figure 28:
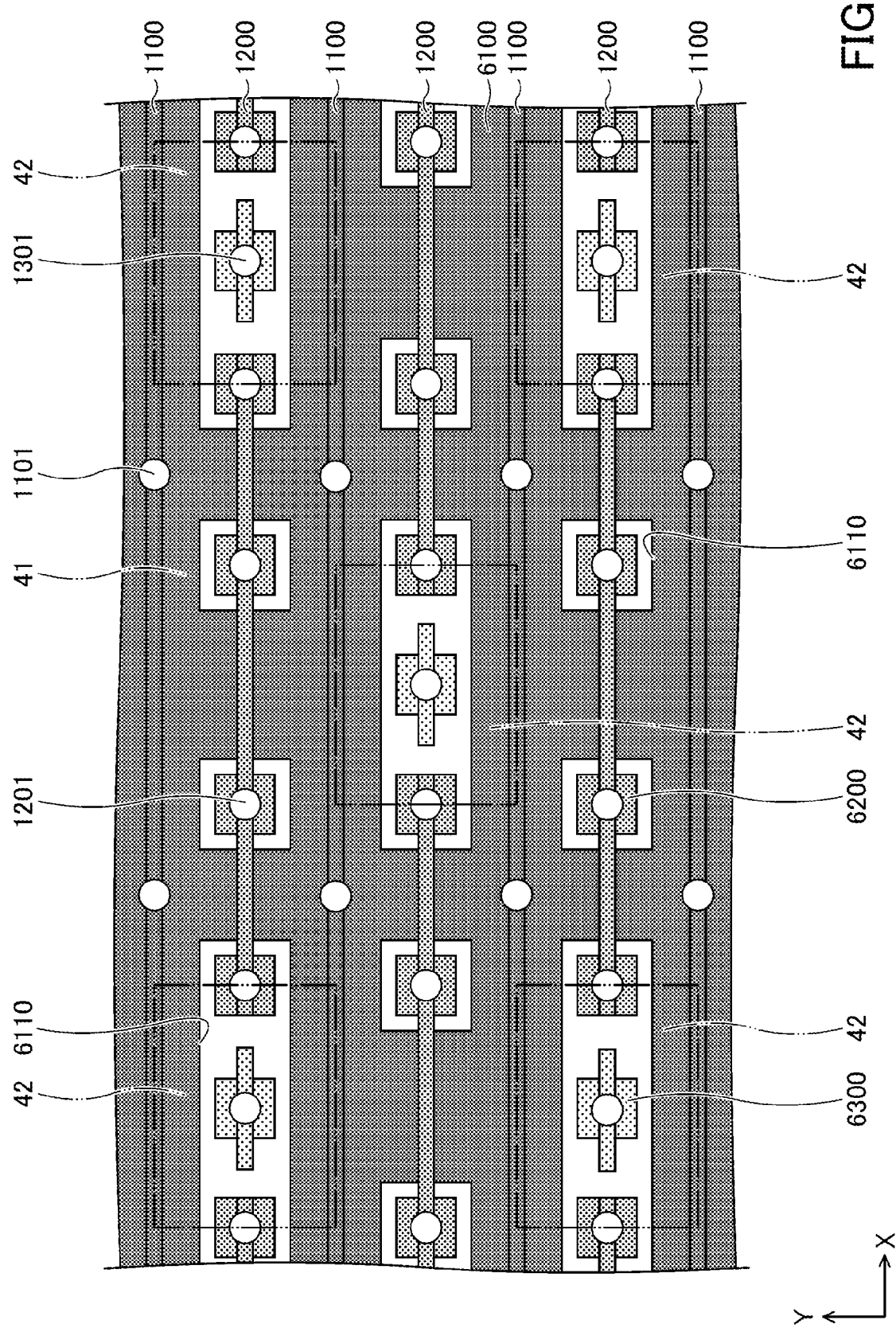
FIG. 28 is a plan view illustrating a configuration of the standard cell area and the second semiconductor chip according to the fourth embodiment.

Next, the fourth embodiment is explained. The fourth embodiment is different from the first embodiment in the configuration of the second semiconductor chip 20. FIG. 24 and FIG. 25 are plan views illustrating a configuration of the second semiconductor chip 20 according to the fourth embodiment. FIG. 24 mainly illustrates a layout of a wiring layer at the side closest to the first semiconductor chip 10. FIG. 25 mainly illustrates a layout of the remaining wiring layer. FIG. 26 to FIG. 27 are cross-sectional views illustrating the second semiconductor chip 20 according to the fourth embodiment. FIG. 26 corresponds to a cross-sectional view taken along line X1-X1 of FIG. 24 and FIG. 25. FIG. 27 corresponds to a cross-sectional view taken along line X2-X2 of FIG. 24 and FIG. 25. FIG. 28 is a plan view illustrating a configuration of a standard cell area and a second semiconductor chip according to the fourth embodiment.

As illustrated in FIG. 24 to FIG. 28, in the fourth embodiment, an insulation film 205 is formed on an insulation film 204, and a conductive film 6100 is formed on the surface of the insulation film 205 in a solid manner. An opening portion 6110 is formed in a portion of the conductive film 6100 that overlaps with the via 1201 or 1301 of the first semiconductor chip 10. In the portion that overlaps with the via 1201, a conductive film 6200 is formed on the inner side of the opening portion 6110. In the portion that overlaps with the via 1301, a conductive film 6300 is formed on the inner side of the opening portion 6110. In a portion that overlaps with the via 1101, the opening portion 6110 is not formed, and the conductive film 6100 is provided. In the insulation film 205, a via 6201 connecting the conductive film 6200 and the power supply line 2200 and a via 6301 connecting the conductive film 6300 and the power supply line 2300 are formed. The conductive films 6100, 6200, and 6300 and the vias 6201 and 6301 are portions of the conductive trace 24. The insulation film 205 is a portion of the insulating layer 25.

In contrast to the first embodiment, the power supply lines 2100 and 3100 are not provided in the second semiconductor chip 20.

The configuration other than the above is similar to the first embodiment.

In the fourth embodiment, the conductive film 6100 functions as the VDDV line. Therefore, the power supply network of the VDDV line can be furthermore strengthened, and the power supply potential of VDDV can be more uniformly provided to the standard cell 41.

Fifth Embodiment

Figure 29:
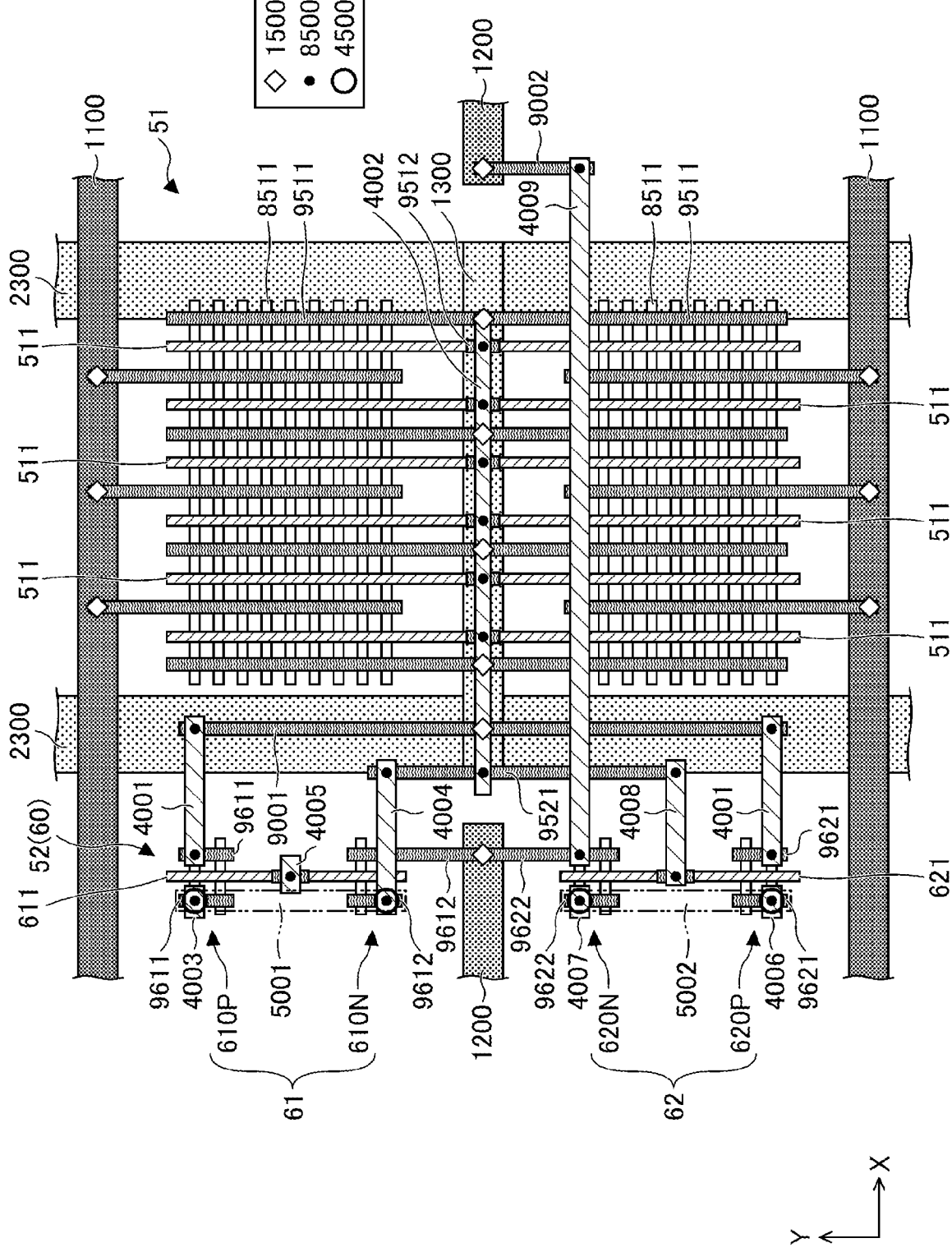
FIG. 29 is a plan view illustrating a configuration of a power supply switch circuit according to a fifth embodiment.

Next, the fifth embodiment is explained. The fifth embodiment is different from the first embodiment in the configuration of the power supply switch circuit 42 in the plan view. FIG. 29 is a plan view illustrating a configuration of the power supply switch circuit 42 according to the fifth embodiment.

As illustrated in FIG. 29, in the fifth embodiment, two power supply lines 2300 are provided in a portion of the second semiconductor chip 20 that overlaps with the power supply switch circuit 42 in the plan view, and the power supply line 1300 in the first semiconductor chip 10 is formed to overlap with these two power supply lines 2300 in the plan view. The power supply line 1300 is connected to these two power supply lines 2300 through vias 1301 at two positions. The vias 1301 are arranged at the two positions where, for example, the power supply line 1300 overlaps with the power supply lines 2300 in the plan view. Although the conductive trace 4001 is connected to the local conductive trace 9611 or 9621 and the local conductive trace 9001, the conductive trace 4001 does not extend to the local conductive traces 9511. From among the local conductive traces 9511, local conductive traces 9511 connected to the source of the switch transistor 51 extend to the conductive trace 4002, and are connected to the conductive trace 4002 through the vias 1500.

The configuration other than the above is similar to the first embodiment.

In the fifth embodiment, the power supply potential of VDD is supplied from the conductive trace 4002 to the local conductive trace 9511 without going through the local conductive trace 9001. The power supply potential of VDD is supplied to the power supply line 1300 through the two power supply lines 2300 and the vias 1301 at the two positions. Therefore, with the switch transistor 51, the power supply potential of VDD can be supplied in a stable manner.

Even when only one set of a power supply line 2300 and a via 1301 is provided for each of the power supply switch circuits 42, the power supply potential of VDD can be supplied from the conductive trace 4002 to the local conductive trace 9511 in a stable manner.

Although the power supply line 2300 located at the right side is arranged at the right edge of the power supply switch circuit 42 in FIG. 29, the power supply line 2300 located at the right side may be arranged at a position that overlaps with the switch transistor 51 in the plan view, and the via 1301 connected to this power supply line 2300 may be arranged in the power supply switch circuit 42.

Sixth Embodiment

Figure 30:
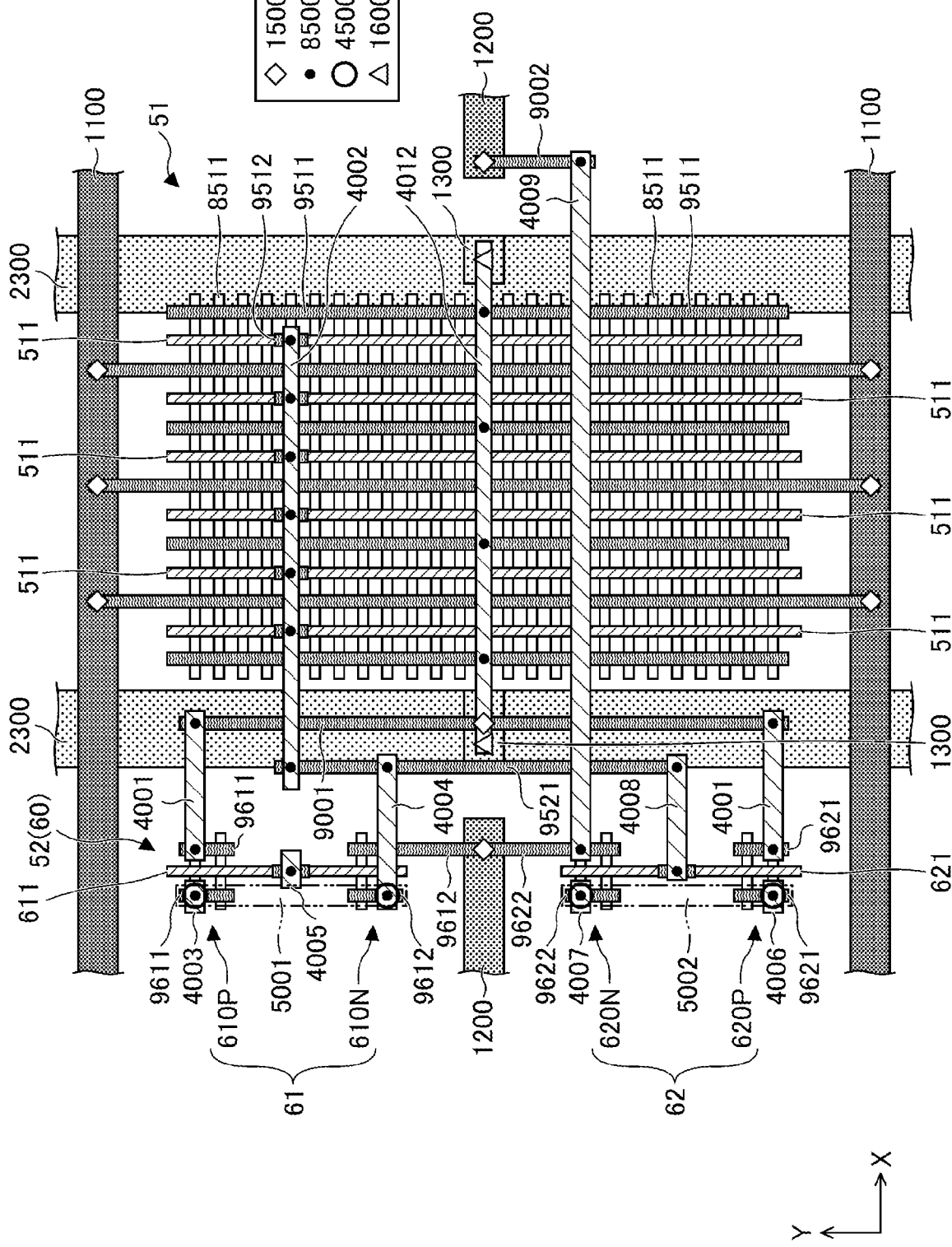
FIG. 30 is a plan view illustrating a configuration of a power supply switch circuit according to a sixth embodiment.

Next, the sixth embodiment is explained. The sixth embodiment is different from the fifth embodiment in the configuration of the power supply switch circuit 42 in the plan view. FIG. 30 is a plan view illustrating a configuration of the power supply switch circuit 42 according to the sixth embodiment.

As illustrated in FIG. 30, in the sixth embodiment, the power supply line 1300 is provided independently for each of the power supply lines 2300. The vias 1301 are arranged at the two positions where, for example, the power supply line 1300 overlaps with the power supply lines 2300 in the plan view. The power supply switch circuit 42 includes a conductive trace 4012 connected to the power supply lines 1300 through vias 1600. The vias 1600 are vias provided between power supply lines and the first wiring layer on or above the power supply lines, and the conductive trace 4012 is provided in the first wiring layer. The conductive trace 4012 is connected, through the via 8500, to the local conductive trace 9511 connected to the source of the switch transistor 51. The conductive trace 4002 is arranged between the power supply line 1100 and the power supply line 1200 in the Y direction, and is connected to the gate electrodes 511 via the local conductive traces 9512. Further, the fins 8511 are formed across a wider range, than the fifth embodiment, between the two power supply lines 1100 adjacent to each other in the Y direction. In other words, in the fifth embodiment, the power supply lines 1300 are provided, and therefore, the fins 8511 are not formed in an area around the center of the two power supply lines 1100 adjacent to each other in the Y direction, but in the sixth embodiment, the fins 8511 are also formed in this area.

The configuration other than the above is similar to the fifth embodiment.

According to the sixth embodiment, effects similar to the effects of the fifth embodiment can be obtained. According to the sixth embodiment, the degree of flexibility in the number, the arrangement, and the like of the fins 8511 of the switch transistor 51 can be further enhanced. Therefore, for example, the arrangement density of the fins 8511 can be increased, and the size of the chip can be reduced.

Seventh Embodiment

Figure 31:
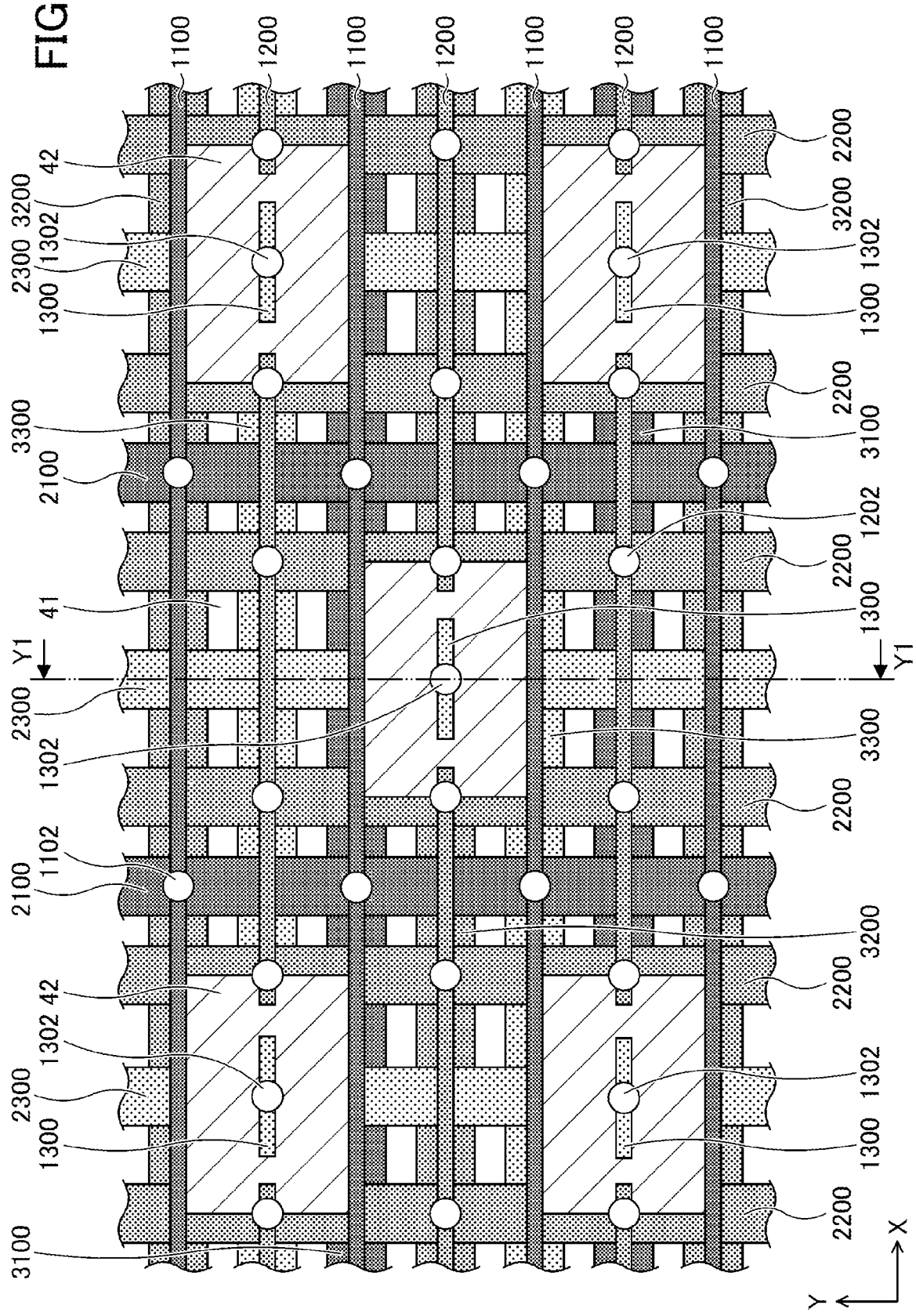
FIG. 31 is a plan view illustrating a configuration of a standard cell area and a second semiconductor chip according to a seventh embodiment.
Figure 32:
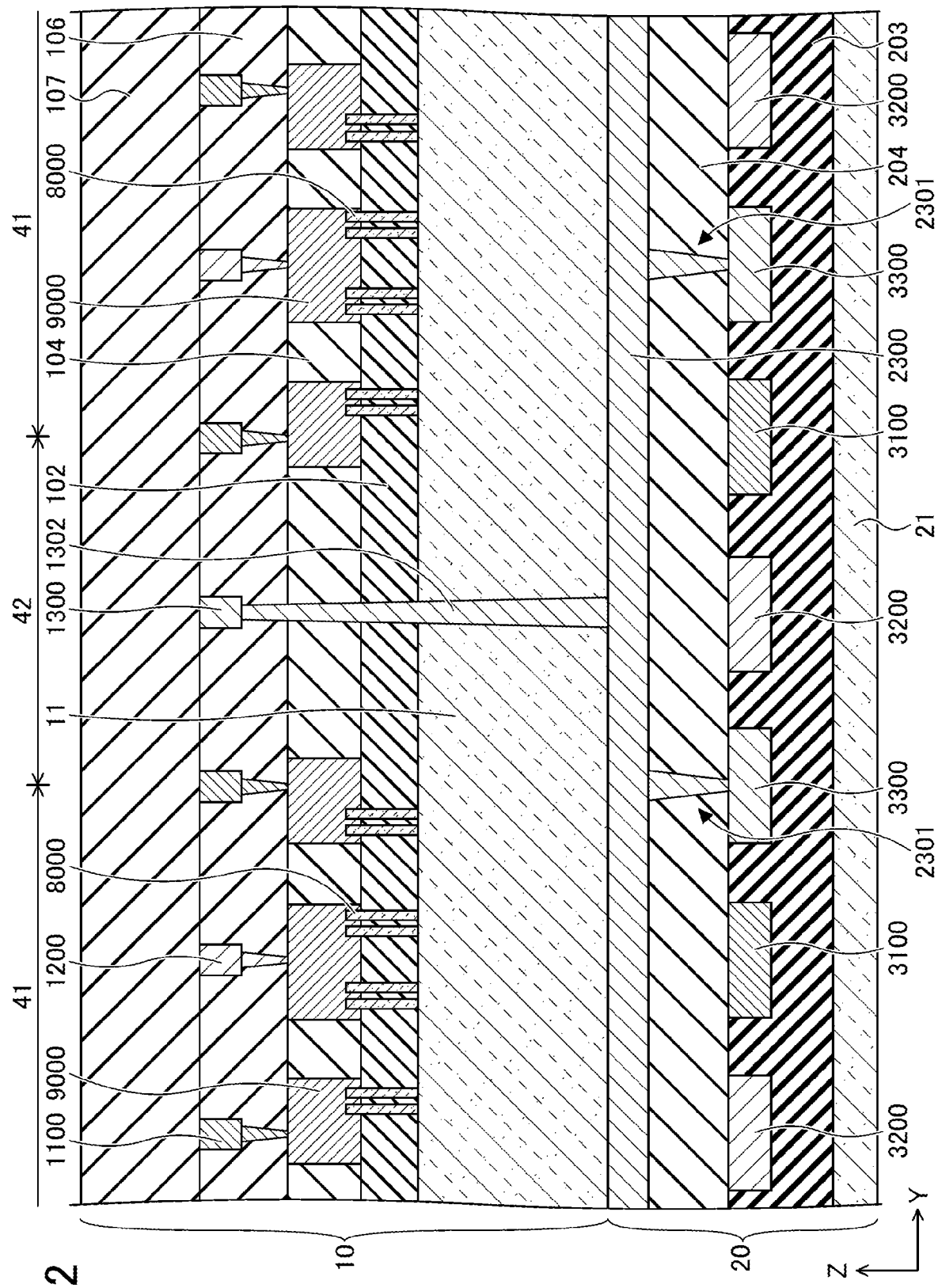
FIG. 32 is a cross-sectional view illustrating the standard cell area and the second semiconductor chip according to the seventh embodiment.

Next, the seventh embodiment is explained. The seventh embodiment is different from the first embodiment in, e.g., the arrangement of the power supply lines 1100, 1200, and 1300. FIG. 31 is a plan view illustrating a configuration of the standard cell area 31 and the second semiconductor chip 20 according to the seventh embodiment. FIG. 32 is a cross-sectional view illustrating the standard cell area and the second semiconductor chip according to the seventh embodiment. FIG. 32 corresponds to the cross-sectional view taken along line Y1-Y1 of FIG. 31.

In the first embodiment, the power supply lines 1100, 1200, and 1300 are formed in a groove formed in the substrate 11 and the element isolation film 102. As illustrated in FIG. 32, in the seventh embodiment, the power supply lines 1100, 1200, and 1300 are formed in the first wiring layer. In other words, the insulation film 106 is formed on the insulation film 104, and the first wiring layer is formed on the surface of the insulation film 106. The power supply lines 1100, 1200, and 1300 are connected to the respective local conductive traces 9000 through the respective vias. The power supply lines 1100 are connected to the power supply lines 2100 through vias 1102. The power supply lines 1200 are connected to the power supply lines 2200 through vias 1202. The power supply lines 1300 are connected to the power supply lines 2300 through vias 1302. The vias 1102, 1202, and 1302 are vias that penetrate through the substrate 11, the element isolation film 102, and the insulation film 104 up to the back surface of the first wiring layer in the insulation film 106.

The insulation film 107 is formed on the insulation film 106, and various conductive traces (the second wiring layer and the like) are formed in the insulation film 107. The insulation films 106 and 107 are portions of the insulating layer 15.

Figure 33:
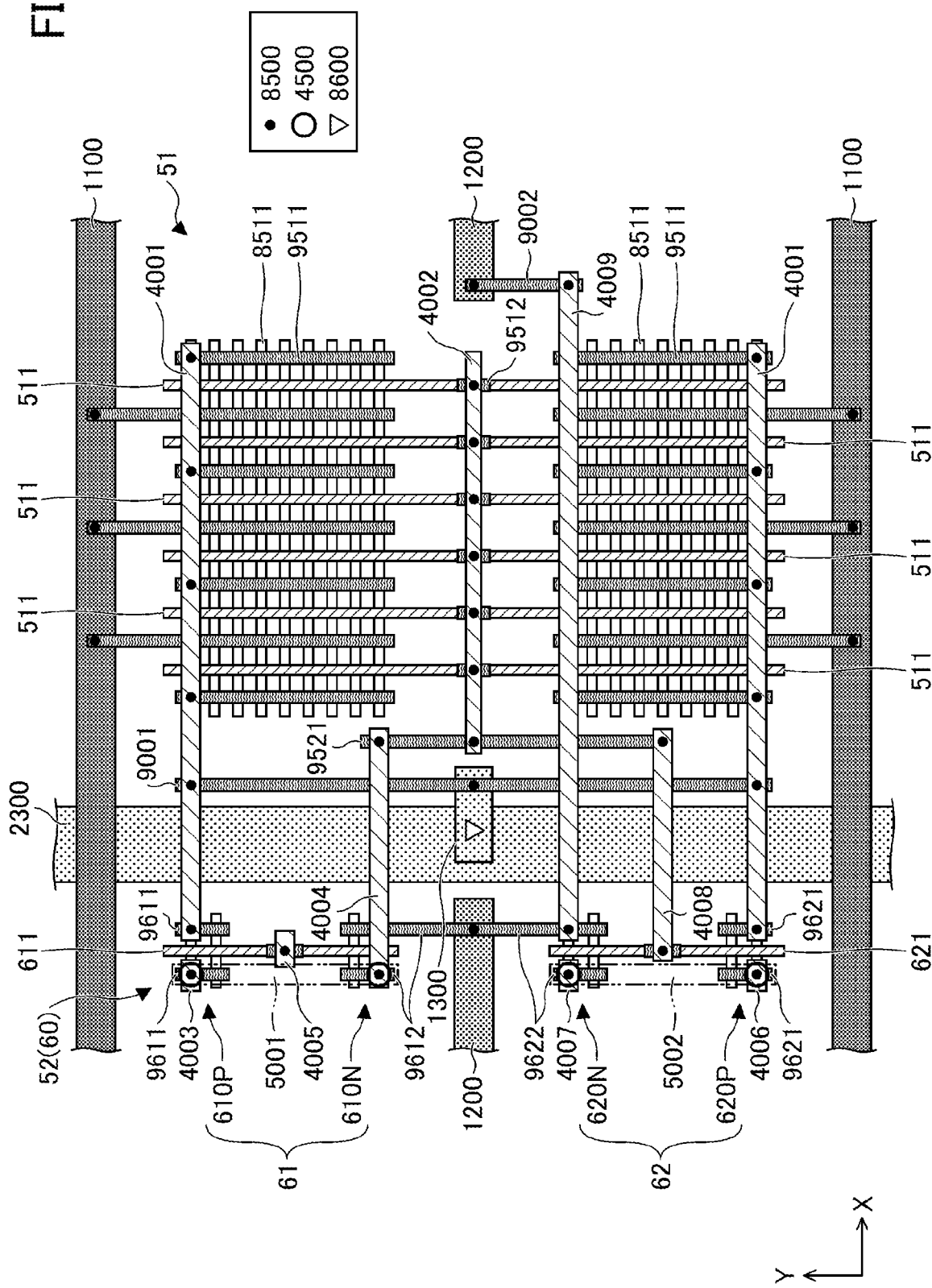
FIG. 33 is a plan view illustrating a configuration of the power supply switch circuit according to the seventh embodiment.

Next, the structure of the power supply switch circuit 42 according to the seventh embodiment is explained. FIG. 33 is a plan view illustrating a configuration of the power supply switch circuit 42 according to the seventh embodiment.

As illustrated in FIG. 33, in the seventh embodiment, in the X direction, the local conductive trace 9001 is located at the side of the switch transistor 51 with respect to the power supply line 2300, and the local conductive trace 9521 is located at the side of the switch transistor 51 with respect to the local conductive trace 9001. This is because the power supply line 1300 is formed in the first wiring layer. The power supply line 1300 is connected to the power supply line 2300 through a via 8600 (1301). The via 8600 is a via extending from the back surface of the substrate 11 to the first wiring layer.

In the seventh embodiment, similarly with the first embodiment, the power supply network is constituted with respect to each of the VDDV line, the VDD line, and the VSS line. Therefore, variation in the power supply potential supplied to the standard cell 41 and the power supply switch circuit 42 can be alleviated. In addition, the power supply lines 2100, 2200, and 2300 are provided in the second semiconductor chip 20, and therefore, the degree of flexibility in the arrangement of the conductive traces in the first semiconductor chip 10 can be improved.

In the second to sixth embodiments, similarly with the seventh embodiment, the power supply lines 1100, 1200, and 1300 may be provided in the first wiring layer. However, in the fifth embodiment, similarly with the sixth embodiment, the power supply line 1300 is assumed to be provided for each of the power supply lines 2300, and the via 1301 is assumed to be provided for each of the power supply lines 1300.

Eighth Embodiment

Figure 34:
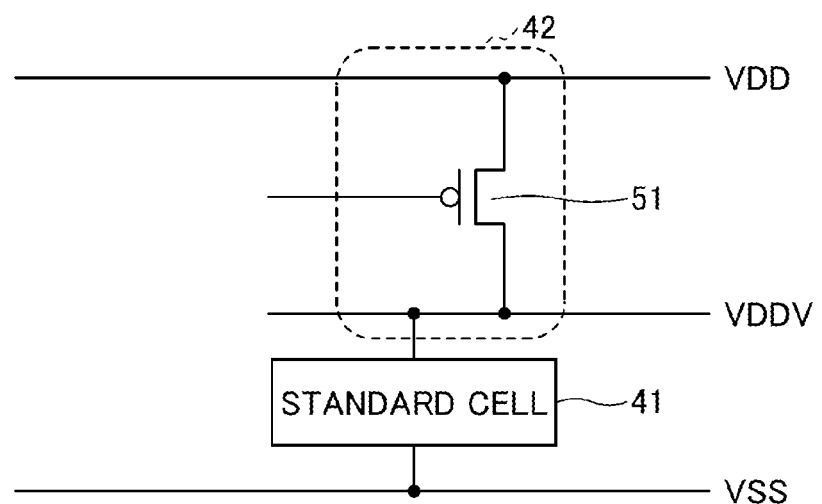
FIG. 34 is a circuit diagram illustrating a power supply switch circuit according to an eighth embodiment.

Next, the eighth embodiment is explained. The eighth embodiment is different from the first embodiment in, e.g., the configuration of the power supply switch circuit 42. FIG. 34 is a circuit diagram illustrating a power supply switch circuit according to the eighth embodiment. FIG. 35 is a plan view illustrating a configuration of a power supply switch circuit according to the eighth embodiment.

As illustrated in FIG. 34 and FIG. 35, in the eighth embodiment, for each cell of the power supply switch circuit 42, a control signal line 2400 for transmitting a control signal from a power supply switch control circuit provided outside of the cell is provided, and the power supply switch control circuit is not provided in the cell of the power supply switch circuit 42. In this case, the power supply switch control circuit may be provided outside of the standard cell area 31. For example, similarly with the power supply lines 2100, 2200, and 2300, the control signal line 2400 is provided in the second semiconductor chip 20, and extends in the Y direction. In the first semiconductor chip 10, a signal line 2401 connected to the control signal line 2400 is provided. Similarly with the power supply lines 1100, 1200, and 1300, the signal line 2401 is formed in a groove formed in the substrate 11 and the element isolation film 102, and the surface of the signal line 2401 is covered with the insulation film 103. In other words, the signal line 2401 is also a BPR. On the back surface side of the substrate 11, the signal line 2401 is formed with a via that extends to the back surface of the substrate 11 and that is connected to the control signal line 2400.

The signal line 2401 is connected to the conductive trace 4002 through the via 1500, the local conductive trace 2402, and the via 8500.

The configuration other than the above is similar to the first embodiment.

In the eighth embodiment, the power supply switch control circuit is not included in the cell of the power supply switch circuit 42, and accordingly, the size of area of the cell of the power supply switch circuit 42 can be reduced.

In the second semiconductor chip 20, similarly with the power supply lines 2100, 2200, and 2300, the control signal line 2400 may be connected in a network form. A single control signal line 2400 or control signal lines 2400 connected in a network form may be connected to multiple power supply switch circuits 42, and the multiple switch transistors 51 may be controlled collectively.

In the second to seventh embodiments, similarly with the eighth embodiment, the power supply switch control circuit may be provided outside of the cell of the power supply switch circuit 42.

In the present disclosure, the switch transistor may be arranged at the side of the VSS line, instead of the side of the VDD line. In other words, in the standard cell, a VSSV line supplying the ground potential may be provided, and the switch transistor may be connected between the VSS line and the VSSV line.

The transistor provided in the power supply switch circuit does not have to be a FinFET. For example, the transistor provided in the power supply switch circuit may be a planar field effect transistor. Alternatively, the transistor provided in the power supply switch circuit may be a transistor using nanowires. Still alternatively, the transistor provided in the power supply switch circuit may be a complementary field effect transistor (CFET) having a structure in which multiple transistors are stacked. For example, the CFET is preferable for an inverter.

According to the disclosed technique, the degree of flexibility in the arrangement of the conductive traces in the semiconductor chip including the power supply switch circuit can be improved.

Although the present invention has been described above with reference to the embodiments, the present invention is not limited to the features described in the embodiments. These features can be changed without departing from the scope of the claimed subject matter, and can be appropriately determined according to the implementation to which the present invention is applied.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a first semiconductor chip; and
   a second semiconductor chip,
   wherein the first semiconductor chip includes:
      a substrate including a first principal surface facing the second semiconductor chip and a second principal surface opposite to the first principal surface;
      a first power supply line and a second power supply line arranged on the second principal surface of the substrate;
      a power supply switch circuit arranged electrically between the first power supply line and the second power supply line;
      a first via arranged in the substrate to extend from the first power supply line to the first principal surface and connected to the first power supply line; and
      a second via arranged in the substrate to extend from the second power supply line to the first principal surface and connected to the second power supply line,
   wherein the second semiconductor chip includes:
      a third power supply line connected to the first via; and
      a fourth power supply line connected to the second via.

2. The semiconductor device according to claim 1, wherein the first power supply line and the second power supply line are formed in the substrate.

3. The semiconductor device according to claim 1, wherein the first power supply line and the second power supply line are formed in a wiring layer arranged on or above the second principal surface of the substrate.

4. The semiconductor device according to claim 1, wherein the first semiconductor chip includes:
   a fifth power supply line arranged on the second principal surface of the substrate; and
   a third via arranged in the substrate and extending from the fifth power supply line to the first principal surface,
   wherein the second semiconductor chip includes a sixth power supply line connected to the third via.

5. The semiconductor device according to claim 4, wherein the fifth power supply line is formed in the substrate.

6. The semiconductor device according to claim 4, wherein the fifth power supply line is formed in a wiring layer arranged on or above the second principal surface of the substrate.

7. The semiconductor device according to claim 4, wherein, in a plan view, the fifth power supply line discontinuously extends in a first direction, and
   wherein the first power supply line is arranged in a portion where the fifth power supply line is discontinuous in the first direction.

8. The semiconductor device according to claim 7, wherein in a second direction perpendicular to the first direction, a position of the first power supply line and a position of the fifth power supply line are the same as each other in the plan view.

9. The semiconductor device according to claim 7, further comprising:
   a seventh power supply line electrically connecting portions of the fifth power supply line that are adjacent in the first direction.

10. The semiconductor device according to claim 9, wherein the seventh power supply line is provided on the second principal surface of the substrate of the first semiconductor chip.

11. The semiconductor device according to claim 4, wherein the first power supply line includes a plurality of first power supply lines,
    the second power supply line includes a plurality of second power supply lines,
    the fifth power supply line includes a plurality of fifth power supply lines, and
    the power supply switch circuit includes a plurality of power supply switch circuits,
    wherein the first semiconductor chip includes the plurality of first power supply lines, the plurality of second power supply lines, the plurality of fifth power supply lines, and the plurality of power supply switch circuits, and
    wherein the plurality of first power supply lines are electrically connected to each other by the third power supply line,
    the plurality of second power supply lines are electrically connected to each other by the fourth power supply line, and
    the plurality of fifth power supply lines are electrically connected to each other by the sixth power supply line.

12. The semiconductor device according to claim 11, wherein the fourth power supply line includes a conductive film having a plurality of opening portions in a plan view, and wherein the third power supply line or the sixth power supply line is arranged in a portion on an inner side of at least one of the plurality of opening portions in the plan view.

13. The semiconductor device according to claim 1, wherein the power supply switch circuit includes a switch transistor electrically connected between the first power supply line and the second power supply line.

14. The semiconductor device according to claim 13, wherein the switch transistor includes:
   a gate electrode;
   a plurality of source areas arranged on a side of the gate electrode;
   a plurality of drain areas arranged on another side of the gate electrode;
   a plurality of first local conductive traces connected to the plurality of source areas;
   a plurality of second local conductive traces connected to the plurality of drain areas;
   a first conductive trace arranged on or above the plurality of first local conductive traces and connected, at a plurality of portions, to the plurality of first local conductive traces; and
   a second conductive trace arranged on or above the plurality of second local conductive traces and connected, at a plurality of portions, to the plurality of second local conductive traces.

15. The semiconductor device according to claim 13, wherein, in a plan view, the first power supply line extends in the switch transistor from a portion overlapping with the first via.

16. The semiconductor device according to claim 15, wherein the first semiconductor chip includes a fourth via arranged in the substrate and extending, at a position away from the first via in the plan view, from the first power supply line to the first principal surface, and
   wherein the second semiconductor chip includes an eighth power supply line connected to the fourth via and electrically connected to the first power supply line.

17. The semiconductor device according to claim 13, wherein the first semiconductor chip includes:
   a ninth power supply line arranged so that the switch transistor is interposed between the first power supply line and the ninth power supply line in the plan view; and
   a fifth via arranged in the substrate to extend from the ninth power supply line to the first principal surface,
   wherein the second semiconductor chip includes:
      a tenth power supply line connected to the fifth via and electrically connected to the first power supply line.

18. The semiconductor device according to claim 13, wherein the power supply switch circuit includes a control circuit configured to control the switch transistor, and
   the first via is located between the switch transistor and the control circuit in the plan view.

19. The semiconductor device according to claim 14, wherein the second semiconductor chip includes a signal line electrically connected to a gate electrode of the switch transistor.

* * * * *